US012463631B2

(12) United States Patent
Li et al.

(10) Patent No.: US 12,463,631 B2
(45) Date of Patent: Nov. 4, 2025

(54) CHARGE PUMP GATE DRIVER CIRCUIT WITH AN ADJUSTABLE PUMP VOLTAGE FOR ACTIVE DV/DT CONTROL

(71) Applicant: The Florida State University Research Foundation, Inc., Tallahassee, FL (US)

(72) Inventors: Hui Li, Tallahassee, FL (US); Zhehui Guo, Tallahassee, FL (US)

(73) Assignee: The Florida State University Research Foundation, Inc., Tallahassee, FL (US)

(*) Notice: Subject to any disclaimer, the term of this patent is extended or adjusted under 35 U.S.C. 154(b) by 106 days.

(21) Appl. No.: 18/373,744

(22) Filed: Sep. 27, 2023

(65) Prior Publication Data

US 2024/0137014 A1 Apr. 25, 2024

Related U.S. Application Data

(60) Provisional application No. 63/416,208, filed on Oct. 14, 2022.

(51) Int. Cl.
*H03K 17/06* (2006.01)
*H03K 17/0412* (2006.01)
*H03K 17/687* (2006.01)

(52) U.S. Cl.
CPC ..... *H03K 17/063* (2013.01); *H03K 17/04123* (2013.01); *H03K 17/6871* (2013.01); *H03K 2217/0081* (2013.01)

(58) Field of Classification Search
CPC .......... H03K 17/063; H03K 17/04123; H03K 17/6871
See application file for complete search history.

(56) References Cited

U.S. PATENT DOCUMENTS

| | | | | |
|---|---|---|---|---|
| 6,535,034 B1* | 3/2003 | Wong | ............ | H10D 84/038 |
| | | | | 257/E21.639 |
| 7,342,437 B2* | 3/2008 | Onaya | ............ | H02M 3/07 |
| | | | | 363/60 |
| 8,742,829 B2* | 6/2014 | Mottola | ............ | H03K 17/063 |
| | | | | 327/434 |
| 11,404,960 B2* | 8/2022 | Gui | ............ | H02M 1/0054 |
| 2003/0156439 A1* | 8/2003 | Ohmichi | ............ | H03K 17/063 |
| | | | | 363/98 |
| 2006/0164135 A1* | 7/2006 | Myono | ............ | H10D 89/215 |
| | | | | 327/112 |

(Continued)

*Primary Examiner* — Menatoallah Youssef
*Assistant Examiner* — Khareem E Almo
(74) *Attorney, Agent, or Firm* — Meunier Carlin & Curfman LLC

(57) ABSTRACT

The disclosure relates to devices, systems and methods implementing a charge pump gate driver (CPGD) that offers adjustable pump voltage, enabling online and active dv/dt and di/dt control for power devices, including the wide bandgap devices, such as SiC MOSFETs and GaN HEMTs. The disclosed CPGD allows a flexible pump voltage adjustment through the pre-charging interval control. Both the turn-on and turn-off switching speed (both dv/dt and di/dt) of power devices can be online regulated rapidly within each switching cycle, without interrupting the power converter operation. The disclosed CPGD has a simple structure and eliminates the extra power supplies to reduce circuit cost and footprint.

23 Claims, 21 Drawing Sheets

(56) References Cited

U.S. PATENT DOCUMENTS

| | | | |
|---|---|---|---|
| 2010/0019807 A1* | 1/2010 | Zhang | H03K 17/145 327/109 |
| 2018/0241391 A1* | 8/2018 | Chandrasekaran | H03F 3/2171 |
| 2018/0248353 A1* | 8/2018 | Creech | H02H 3/08 |
| 2020/0076425 A1* | 3/2020 | Garg | H03K 17/6871 |
| 2022/0109380 A1* | 4/2022 | Sakai | H03K 17/127 |
| 2022/0247404 A1* | 8/2022 | Ye | H03K 17/567 |

* cited by examiner

CHARGE PUMP GATE DRIVER CIRCUIT WITH AN ADJUSTABLE PUMP VOLTAGE FOR ACTIVE DV/DT CONTROL

CROSS-REFERENCE TO RELATED APPLICATION

This application claims priority to and benefit of U.S. provisional patent application 63/416,208 filed Oct. 14, 2022, which is fully incorporated by reference.

STATEMENT OF GOVERNMENT SUPPORT

This invention was made with government support under DE-AV0100517 awarded by the Department of Energy. The government has certain rights in the invention.

BACKGROUND

Electrical switching devices, such as transistors, generally require an input current or voltage to switch the state of the switching device. The switching current or voltage may be greater than the current or voltage that the circuit controlling the switching device can produce. This is common in applications where the controller is a microcontroller or other integrated circuit, and the switching device is a high-power device such as a power MOSFET (metal-oxide-semiconductor field effect transistor). Gate driver circuits are used to amplify the output current or voltage of the control circuit to produce a current and/or voltage large enough to switch the state of the switching device.

The recent wide bandgap (WBG) devices, such as SiC MOSFETs and GaN HEMTs, have gained significant attention in high-frequency and high-power applications due to their advantages, including the fast switching speed, low switching and conduction losses, and enhanced capacity to withstand high junction temperature. However, the inherent fast switching characteristics of WBG devices usually result in challenges, such as severe electromagnetic interference (EMI) emissions, false-triggering and other adverse effects during switching transients.

To balance the switching losses and the side effects caused by the fast switching speed, active gate drivers (GDs) have been developed. The existing active GDs fall into several categories: (1) variable gate resistance GD; (2) variable input capacitance GD; (3) variable gate current GD; and (4) variable voltage source GD (VSGD). The variable gate resistance GD is realized by either paralleling multiple series branches of "gate resistor+switch" or directly paralleling multiple totem poles, each connecting with different gate resistances. By controlling these switches and totem pole drivers, the effective gate resistance inserted into the gate loop can be adjusted during switching transients, thereby changing dv/dt and di/dt. However, the added switches or totem poles in the implementation increase the circuit cost and complexity. The variable input capacitance GD is realized by combining multiple series branches of "capacitor+switch" between the gate-drain and gate-source terminals, acting as external gate-drain and gate-source capacitance. The total effective gate-drain and gate-source capacitances can be modified by inserting different external capacitors through controlling switches, which in turn results in different dv/dt and di/dt. However, this approach has many drawbacks, including heightened complexity, increased costs, added turn-on and -off delays, the need for high-voltage rated capacitors, and increased crosstalk risks. The variable gate current GD is achieved by employing multiple current sources or a controlled current mirror circuit. This configuration allows for the alteration of gate charging/discharging current during the switching transients, to change dv/dt and di/dt. However, the implementation of high gate current magnitudes often requires substantial inductors. The variable VSGD attracts the most attention since it utilizes the adjustable gate driving reference voltages, which working principle is similar with the conventional fixed two-level VSGD. However, this approach requires adding additional power supplies, or alternatively, programmable power supplies with capability for rapid adjustability during switching cycles. Moreover, precise timing control should be properly implemented to avoid overcharging issues.

All these existing active GDs require not only additional passive components, switches and power supplies, but also dedicated timing control. These requirements limit the use of these active GDs.

Therefore, what is needed are devices, methods, and systems overcome challenges in the art, some of which are described above. In particular, devices, methods, and systems implementing a charge pump gate driver circuit with an adjustable pump voltage for active dv/dt control are desired.

SUMMARY

Disclosed and described herein are embodiments of devices, methods, and systems for implementing a CPGD that provides an adjustable and flexible pump voltage spanning from the driving reference voltage to twice its value. This innovation enables active dv/dt and di/dt control for power devices. Furthermore, the disclosed CPGD enables fast online regulation of both turn-on and turn-off switching speeds during each switching cycle. These advantages are achieved without the need for extra power supplies, which in turn reduces circuit costs and space requirement, and dedicated timing control to avoid overcharging issues.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The accompanying drawings, which are incorporated in and constitute a part of this specification, illustrate embodiments and together with the description, serve to explain the principles of the disclosed technology.

DETAILED DESCRIPTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
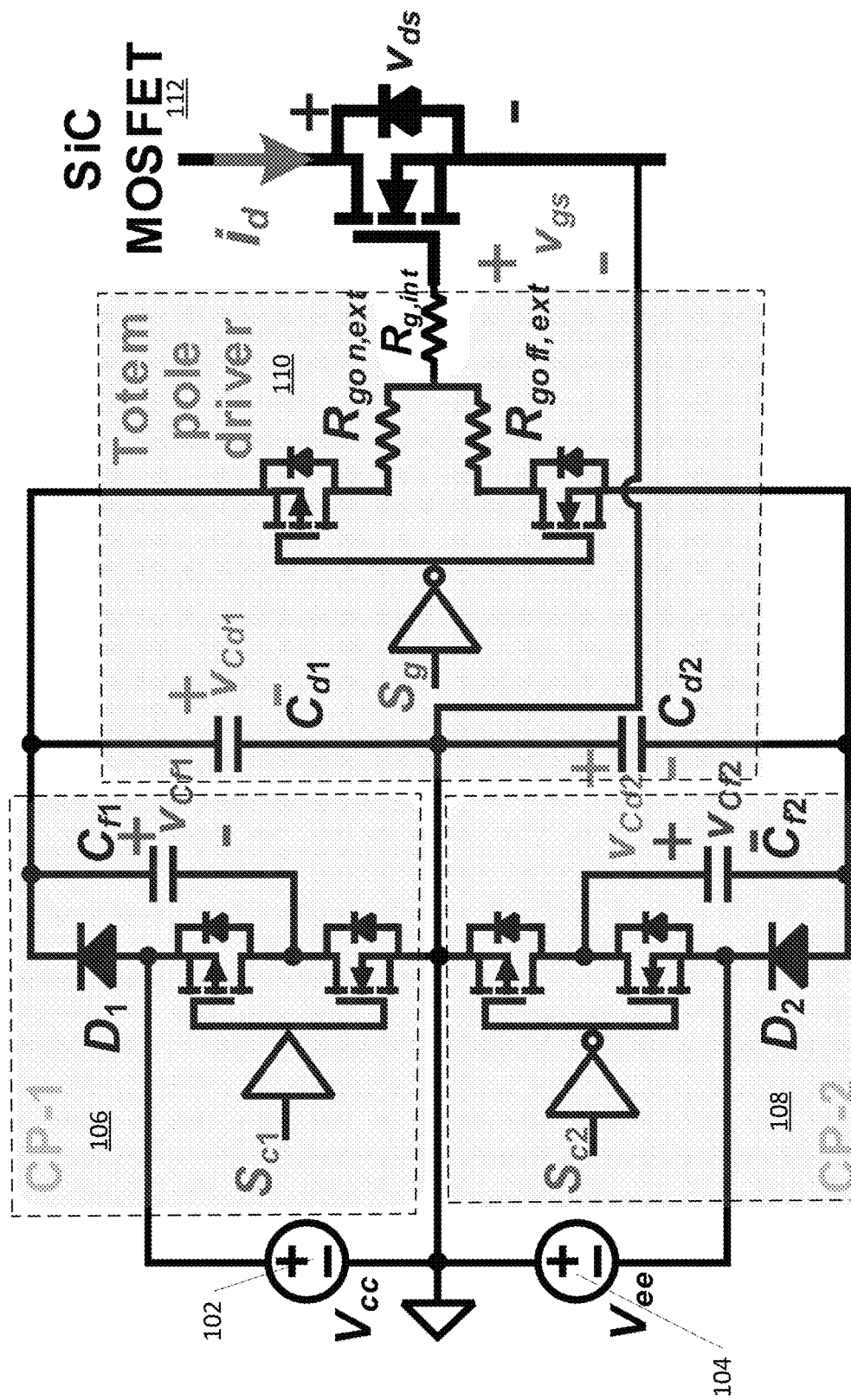
FIG. 1 illustrates an exemplary circuit schematic of an embodiment of a CPGD.

FIG. 1 illustrates an exemplary circuit schematic of an embodiment of a CPGD 100. The embodiment in FIG. 1 comprises two power supplies, $V_{cc}$ 102 and $V_{ee}$ 104, that provide positive and negative reference voltages, respectively. The voltage level of $V_{cc}$ 102 is determined by the required positive driving voltage for the power device 112, typically within the range of about 12V to about 20V. The voltage level of $-V_{ee}$ 104 is determined by the required negative driving voltage for the power device 112, typically within the range of about −8V to about −3V. FIG. 1 further illustrates two charge pumps (CPs) identified by dashed lines, CP-1 106 and CP-2 108, that control the turn-on and turn-off switching speed of power device (here, power device is SiC MOSFET 112), respectively. Each CP comprises of one pair of MOSFETs, one diode ($D_1$ for CP-1, and $D_2$ for CP-2), and one flying capacitor ($C_{f1}$ for CP-1 or $C_{f2}$ for CP-2). The voltage rating of MOSFETs and diode in CP-1 should be higher than $V_{cc}$ 102. The voltage rating of MOSFETs and diode in CP-2 should be higher than $V_{ee}$ 104. These components are not limited to any particular manufacturer. The capacitance values for $C_{f1}$ and $C_{f2}$ are determined based on the specifications of power device 112, and are calculated using equations (1) and (3), below. Further comprising the CPGD 100 of FIG. 1 is a MOSFET based totem-pole driver 110 with two decoupling capacitors, $C_{d1}$ and $C_{d2}$, and split outputs to connect the external ON and OFF gate resistors, $R_{gon,ext}$ and $R_{goff,ext}$. The capacitance values for $C_{d1}$ and $C_{d2}$ are determined by the maximum "positive" pump voltage, $V_{Cd1,max}$, and the maximum "negative" pump voltage, $V_{Cd2,max}$, respectively, which are calculated using equations (2) and (4), below. The $V_{Cd1,max}$ value is in the range of about 0V to about $V_{Cd1,th1}$, while $V_{Cd2,max}$ value is in the range of about 0V to about $V_{Cd2,th1}$. $R_{gon,ext}$ and $R_{goff,ext}$ are configured in accordance with the power device 112 specifications and the specific requirements of the application. Typically, their values can range from about 0 ohms to about 30 ohms.

In FIG. 1, $S_{c1}$, $S_{c2}$ and $S_g$ are control signals for CP-1 106, CP-2 108, and totem-pole driver 110, respectively. $v_{Cf1}$ and $v_{Cf2}$ are the voltages across $C_{f1}$ and $C_{f2}$, respectively. These voltages are variables that change during the pre-charge and discharge processes of CP operation. The voltage $v_{Cf1}$ has a dynamic range from $-V_{df}$ to $V_{cc}-V_{df}$, while the voltage $v_{Cf2}$ has a dynamic range from $-V_{df}$ to $V_{ee}-V_{df}$. $v_{Cd1}$ and $v_{Cd2}$ are the voltages across $C_{d1}$ and $C_{d2}$, respectively. $v_{gs}$, $v_{ds}$ and $i_d$ are the internal gate-source voltage, drain-source voltage, and drain current of the power device 112. $R_{g,int}$ is the internal gate resistor of power device 112. The forward voltage drop of $D_1$ or $D_2$ is $V_{df}$. $v_{gs}$, $v_{ds}$, and $i_d$ are variables. $v_{gs}$, has a dynamic range from about $-(V_{ee}+V_{df})$ to about $(V_{cc}-V_{df})$. $v_{ds}$ has a dynamic range from about 0 to $V_{dc}$ (dc-link voltage). $i_d$ has a dynamic range from about 0 to about the maximum load current, which is determined by the application. The internal gate resistor is inside the power device 112 and it is determined by the power device manufacturer. The CPGD 100 regulates the switching speed (both the current slew rate, di/dt, and voltage slew rate, dv/dt) of power device 112 without adding additional power supplies or dedicated timing circuits, which enables the circuit cost and footprint reduction. Moreover, the switching speed regulation of CPGD 100 can be rapidly accomplished within each individual switching cycle.

Figure 2:
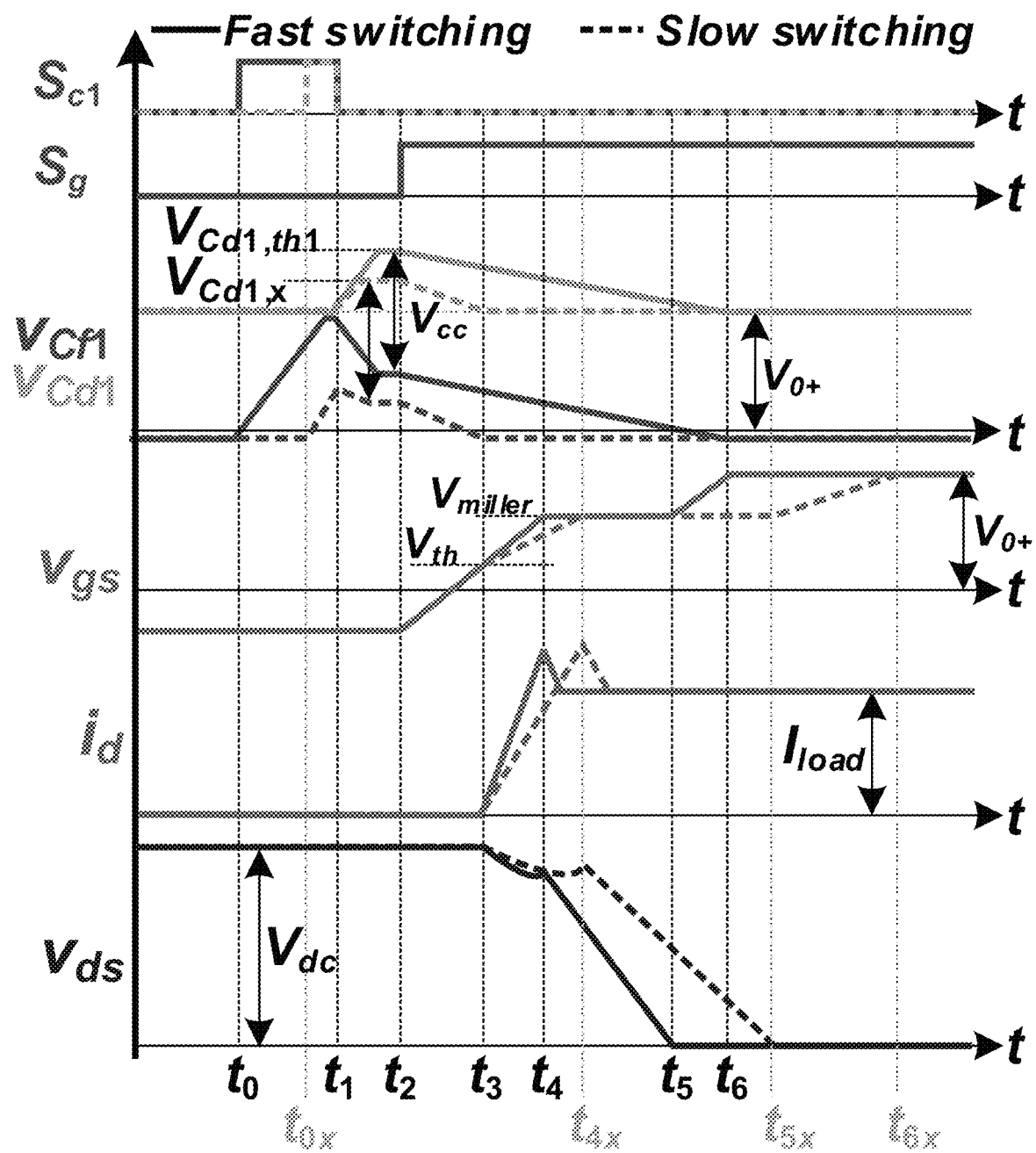
FIG. 2 illustrates operational waveforms of a CPGD during the turn-on process.

The operation of the CPGD 100 is described below. FIG. 2 illustrates operational waveforms of CPGD 100 during the turn-on process. By adjusting the pulse width of $S_{c1}$, $C_{f1}$ can be pre-charged to varying levels, allowing $v_{Cf1}$ to attain different magnitudes at $t_1$. The pulse width range is set based on the power device specifications and the desired turn-on switching speed for the specific application. Typically, it can vary from about 0 to several hundred nanoseconds. The pre-charging value can be changed by adjusting the pulse width of $S_{C1}$, and it is in the range of about $-V_{df}$ to about $(V_{cc}-V_{df})$. The attained different magnitudes can be changed by adjusting the pulse width of $S_{c1}$, and it is in the range of $-V_{df}$ to $(V_{ee}-V_{df})$. Subsequently, $C_{d1}$ is charged by discharging $C_{f1}$, which in turn pumps $v_{Cd1}$ to varying voltage levels during the subinterval $[t_1 \sim t_2]$. The pump voltage level of $v_{Cd1}$ is varied according to the given pulse width of $S_{c1}$, and it is in the range of about $(V_{cc}-V_{df})$ to about $V_{Cd1,th1}$, where the $V_{Cd1,th1}$ is derived in equation (5), below. The different pump voltage of $v_{Cd1}$ at $t_2$ leads to varying gate current, which depends on the specifications of the power device 112 and the setting of $R_{gon,ext}$, after the totem-pole driver is tied to high output voltage at $t_2$, enabling different $i_d$ current rising rate and $v_{ds}$ voltage falling rate of power device 112.

As shown by the solid lines in FIG. 2, with a longer pulse width of $S_{c1}$, a higher pump voltage is applied (e.g., $V_{Cd1,th1} > V_{Cd1,x}$), a higher gate current is therefore activated after the totem-pole driver is tied to high output voltage, in turn, results in faster turn-on switching speed, including accelerated $i_d$ current rising rate, i.e., $(t_4-t_3)<(t_{4x}-t_3)$, and accelerated $v_{ds}$ voltage falling rate, i.e., $(t_5-t_4)<(t_{5x}-t_{4x})$. The fastest turn-on switching speed is expressed by the minimum id current rising time and the minimum $v_{ds}$ voltage falling time derived in equations (6)-(7), below, while the slowest turn-on switching speed is expressed by the maximum $i_d$ current rising time and the maximum $v_{ds}$ voltage falling time derived in equations (8)-(9), below. The "faster" speed here means it is closer to the fastest turn-on switching speed. The $i_d$ current rising rate=$i_{load}/i_d$ current rising time. The $v_{ds}$ voltage falling rate=$V_{dc}/v_{ds}$ voltage falling time. The accelerated $i_d$ current rising rate and $v_{ds}$ voltage falling rate mean that the corresponding $i_d$ current rising time and $v_{ds}$ voltage falling time are closer to the results derived in equations (6)-(7), below.

Taking the fast switching waveforms shown in FIG. 2 as an example, equivalent circuits corresponding to each subinterval during the turn-on process are depicted in FIGS. 3A-3E, and the operation during the turn-on process is briefly explained below.

Figure 3A:
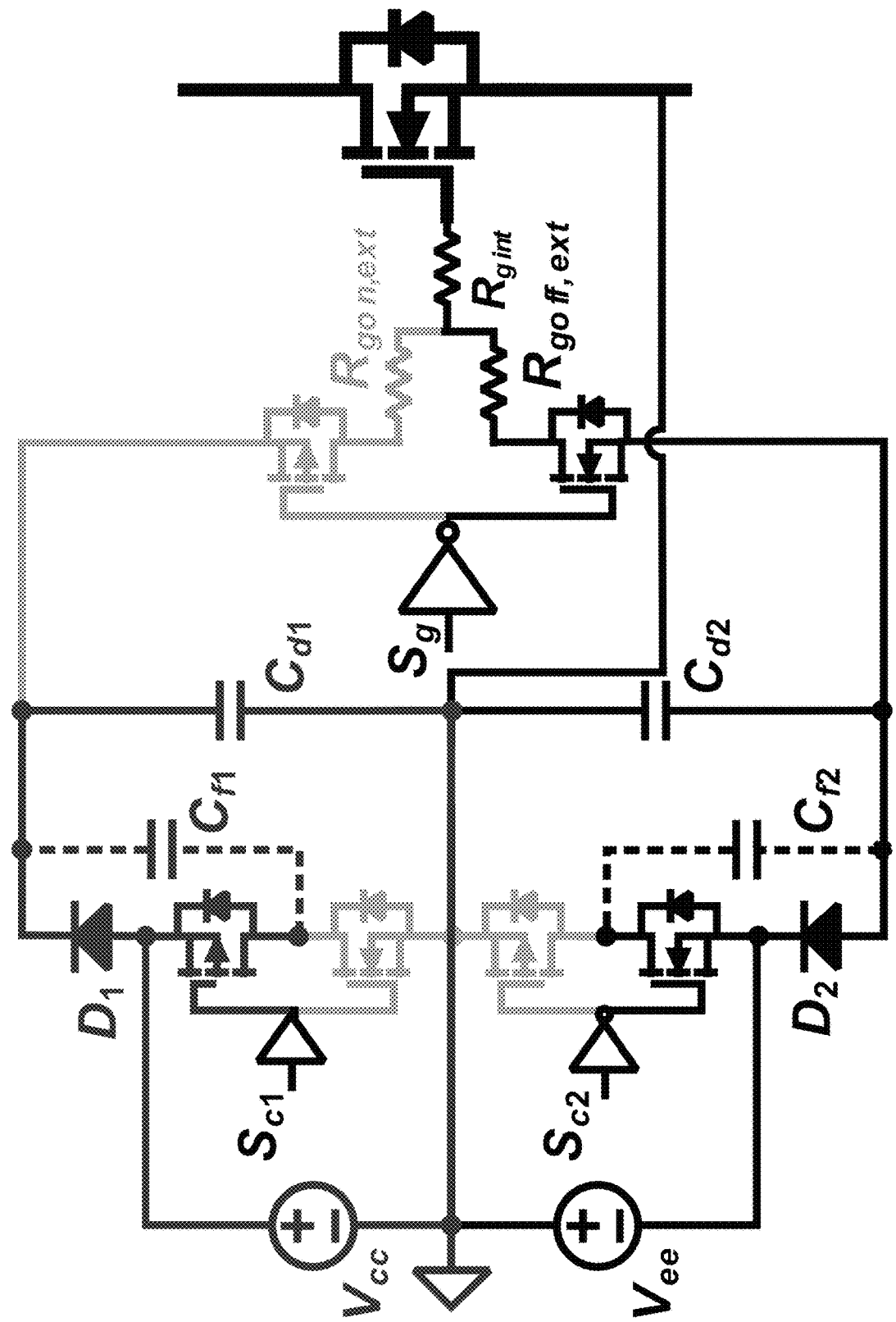
FIGS. 3A-3E illustrate equivalent circuits corresponding to subintervals during the turn-on process of a CPGD.

FIG. 3A illustrates the subinterval before $t_0$. As shown in FIG. 3A, both $S_{c1}$ and $S_g$ remain at the low level. $C_{f1}$ is fully discharged (during the steady OFF state of power device) and clamped by $D_1$. $C_{d1}$ is clamped by $V_{cc}$ through $D_1$. During this subinterval, $v_{Cf1}=-V_{df}$ and $v_{Cd1}=V_{0+}=V_{cc}-V_{df}$.

Figure 3B:
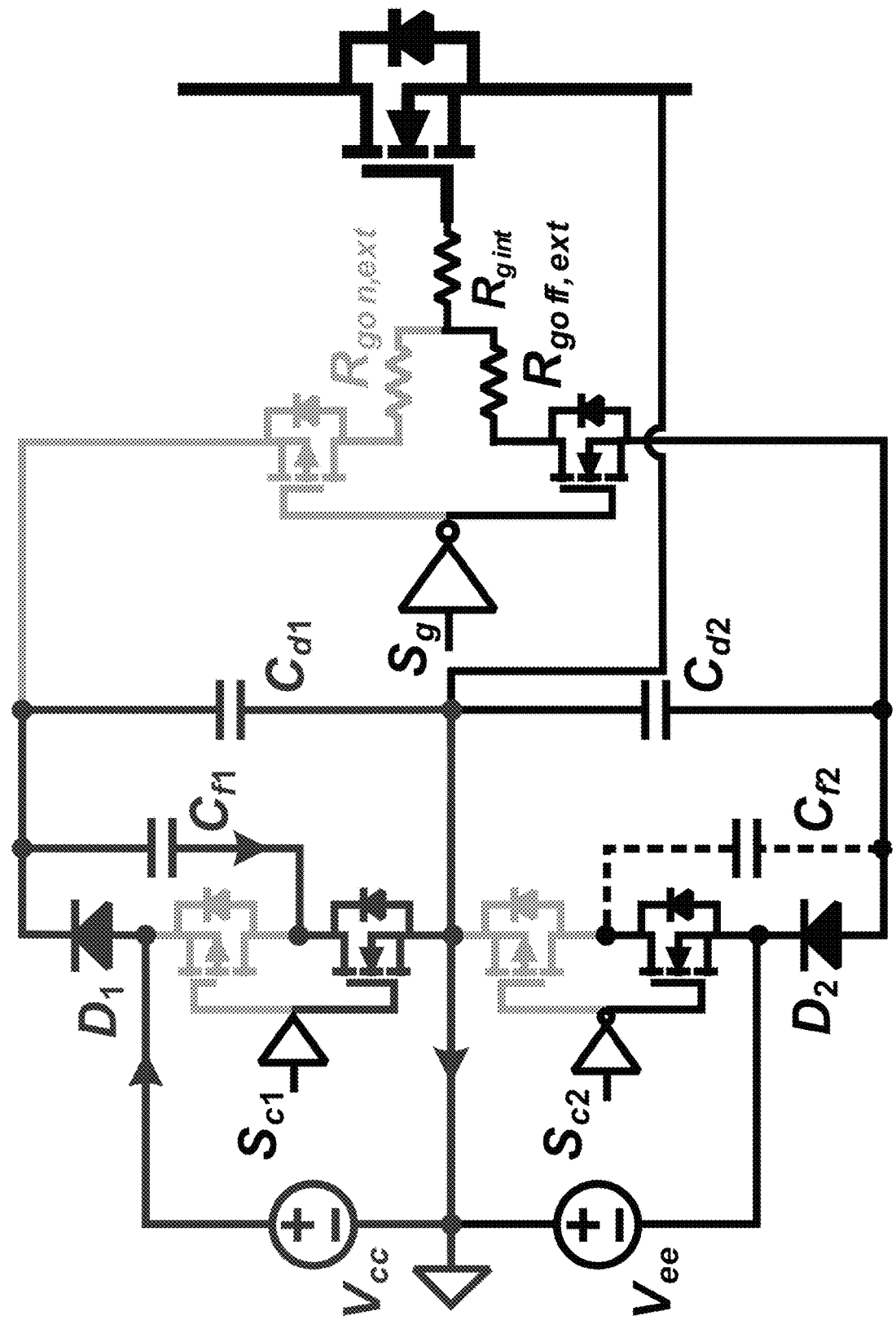

FIG. 3B illustrates the subinterval $[t_0 \sim t_1]$. At to, $S_{c1}$ changes to the high level, initiating the pre-charging of $C_{f1}$ through $D_1$ using $V_{cc}$ supply 102. This pre-charging continues until or completes before $t_1$. During this subinterval, $v_{Cf1}$ increases and $v_{Cd1}$ remains unchanged.

Figure 3C:
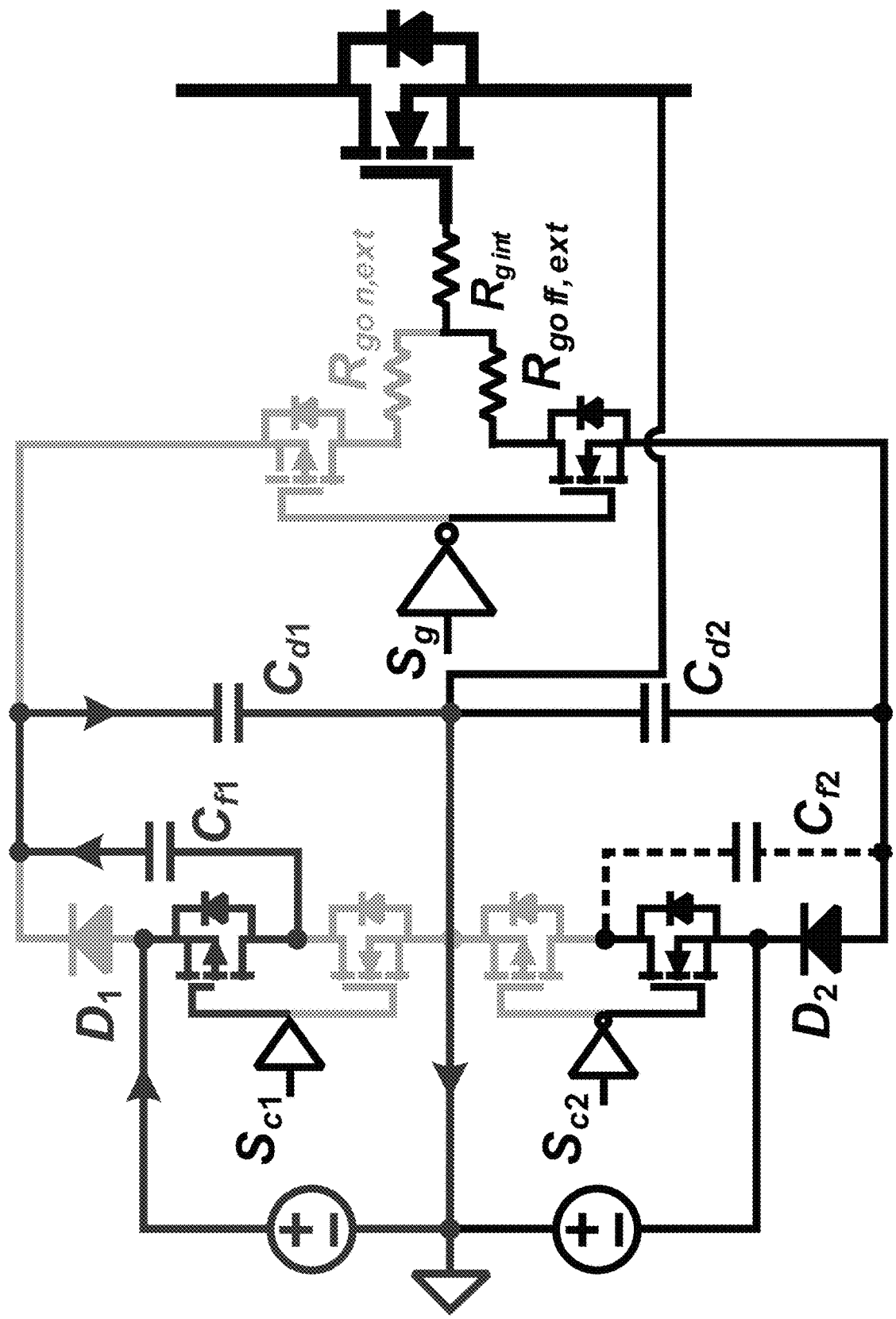

FIG. 3C illustrates the subinterval $[t_1 \sim t_2]$. At $t_1$, $S_{c1}$ changes to the low level, allowing $C_{f1}$ is series with $V_{cc}$ supply 102 to charge $C_{d1}$, $v_{Cd1}$ therefore increases and reaches the "positive" pump voltage (i.e., $V_{Cd1,th1}$ shown in FIG. 2) at $t_2$. Due to the charge transfer mechanism, $v_{Cf1}$ decreases, and the difference between $v_{Cf1}$ and $v_{Cd1}$ reaches a level of $V_{cc}$ at $t_2$.

Figure 3D:
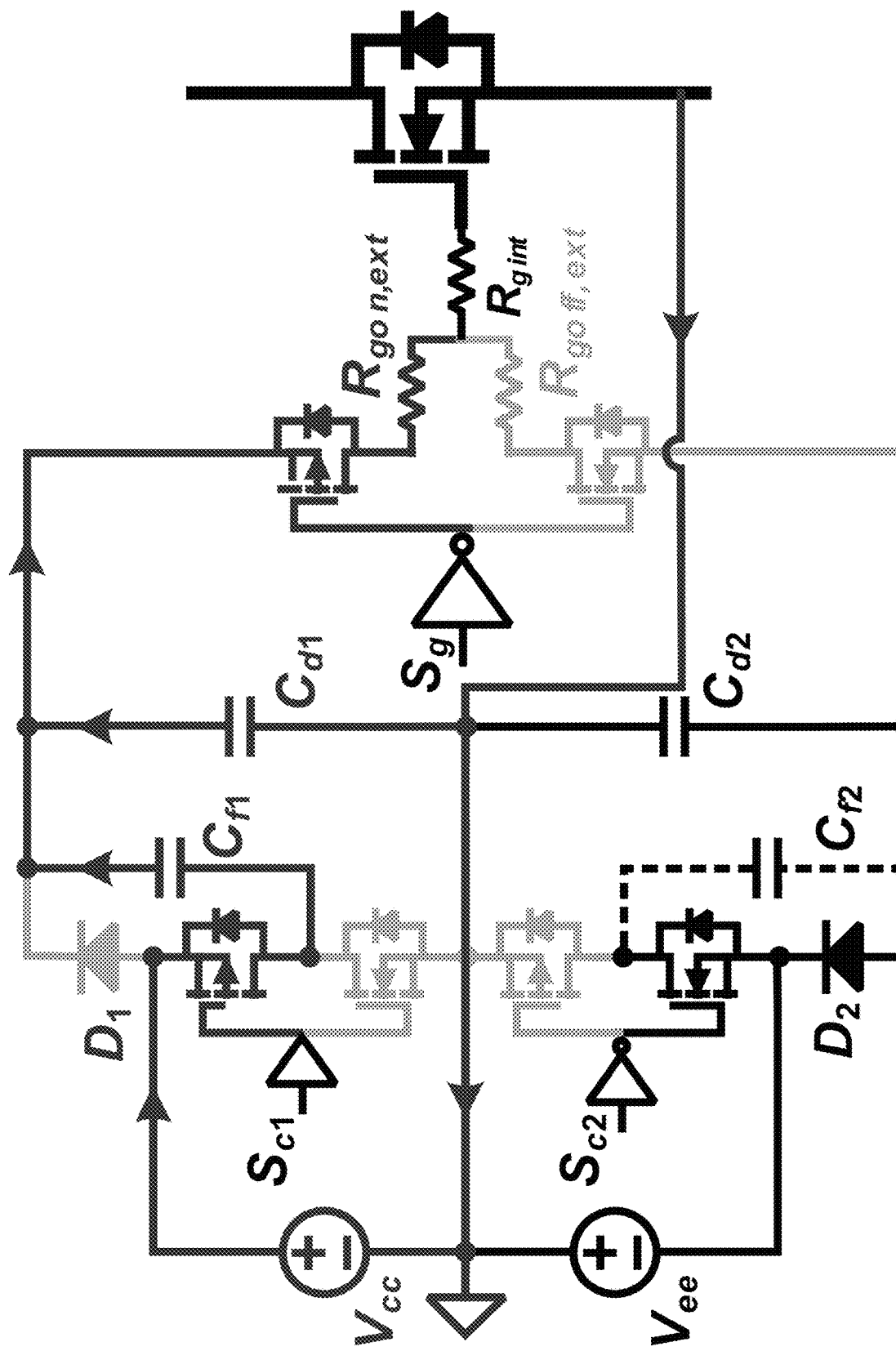

FIG. 3D illustrates the subinterval $[t_2-t_6]$. At $t_2$, $S_g$ changes to the high level, resulting in the discharging of both $C_{d1}$ and $C_{f1}$. This discharging process provides the gate current to charge the gate-source capacitance $C_{gs}$ of power device. During this subinterval, $v_{gs}$ increases, ultimately reaching the threshold voltage $V_{th}$ of power device at $t_3$. Following $t_3$, the drain current $i_d$ of power device 112 starts to rise, reaching its peak value at $t_4$ when $v_{gs}$ reaches the Miller voltage $V_{miller}$. Following $t_4$, $v_{ds}$ of power device starts to fall until it reaches approximately 0 at $t_5$. After $t_5$, $v_{gs}$ continues to rise until it reaches the steady-state value of $V_{0+}$ at $t_6$. During this subinterval, both $v_{Cf1}$ and $v_{Cd1}$ decrease and subsequently are fully discharged at $t_6$, that is $v_{Cf1}=-V_{df}$ and $v_{Cd1}=V_{0+}$.

Figure 3E:
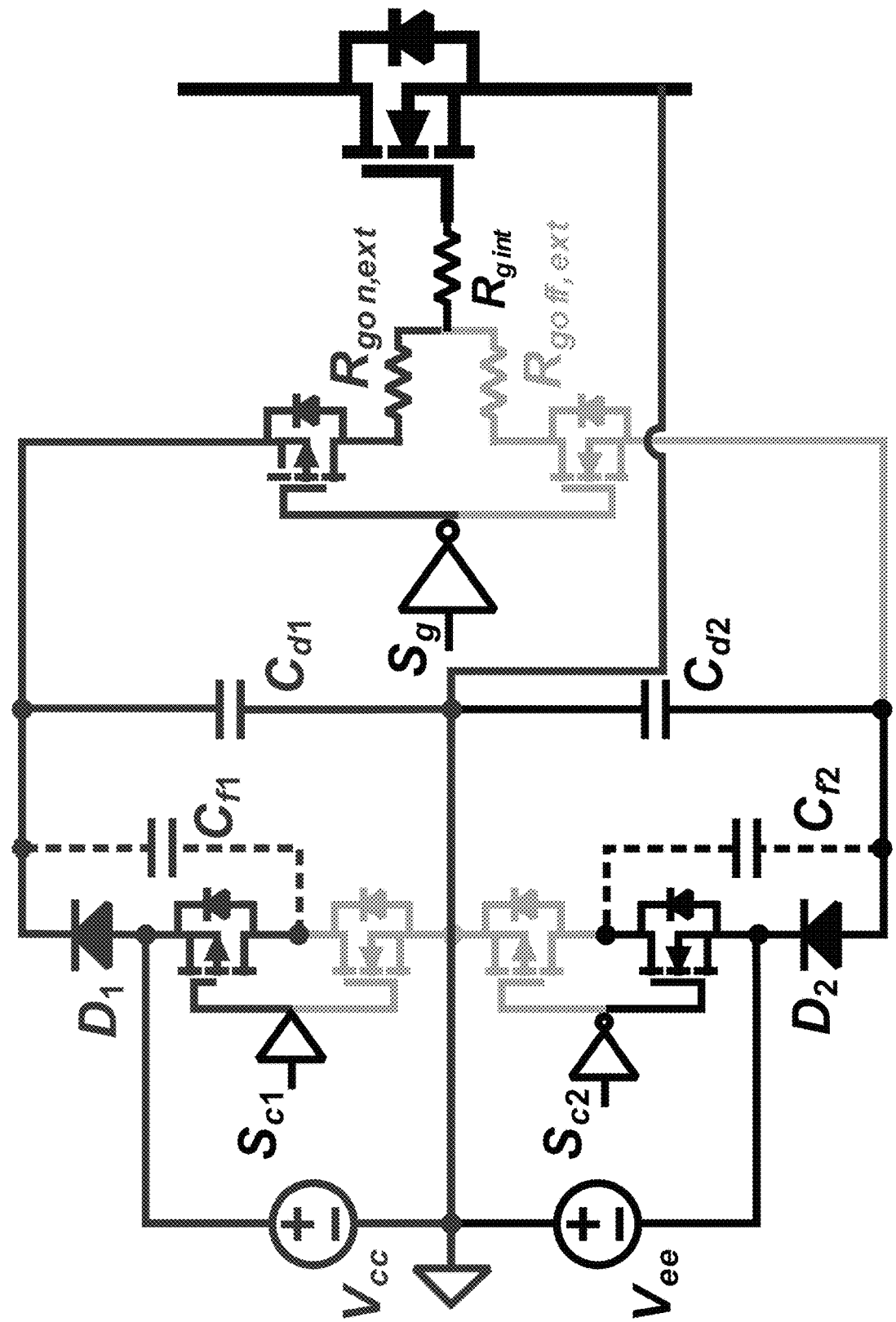

FIG. 3E illustrates the subinterval after $t_6$. $D_1$ conducts, causing both $v_{Cd1}$ and $v_{gs}$ to be clamped by $V_{cc}$ supply 112 through $D_1$, which remains during rest of the steady ON state of power device.

Figure 4:
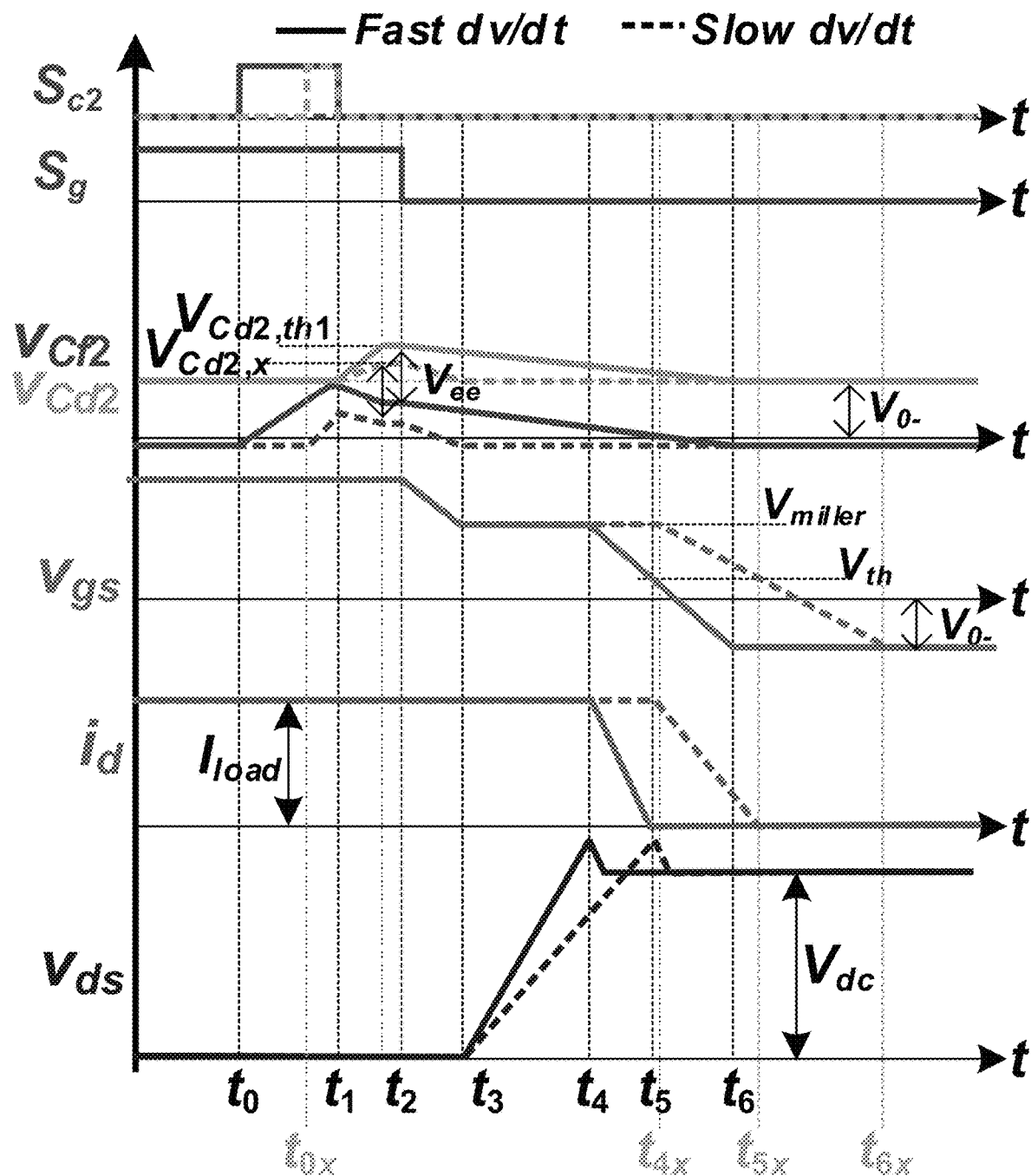
FIG. 4 illustrates operational waveforms of a CPGD during the turn-off process.

FIG. 4 illustrates operational waveforms of CPGD 100 during the turn-off process. By adjusting the pulse width of $S_2$, $C_{f2}$ can be pre-charged to varying levels, allowing $v_{Cf2}$ to attain different magnitudes at $t_1$. The pulse width range is set based on the power device 112 specifications and the desired turn-off switching speed for the specific application. Typically, it can vary from about 0 to several hundred nanoseconds. The pre-charging value can be changed by adjusting the pulse width of $S_{c2}$, and it is in the range of about $-V_{df}$ to about $(V_{ee}-V_{df})$. The attained different magnitude can be changed by adjusting the pulse width of $S_{c2}$, and it is in the range of about $-V_{df}$ to about $(V_{ee}-V_{df})$. Subsequently, $C_{d2}$ is charged by discharging $C_{f2}$, which in turn pumps $v_{Cd2}$ to varying voltage levels during the subinterval $[t_1 \sim t_2]$. The pump voltage level of $v_{Cd2}$ is varied according to the given pulse width of $S_{c2}$, and it is in the range of about $(V_{ee}-V_{df})$ to about $V_{Cd2,th1}$, where $V_{Cd2,th1}$ is derived in equation (10), below. The different pump voltage of $v_{Cd2}$ at $t_2$ leads to varying gate current after the totem-pole driver is tied to low output voltage at $t_2$, enabling different $v_{ds}$ voltage rising rate and $i_d$ current falling rate of power device. As shown by the solid lines in FIG. 4, with a longer pulse width of $S_{c2}$, a higher pump voltage is applied (e.g., $V_{Cd2,th1} > V_{Cd2,x}$), a higher gate current is therefore activated after the totem-pole driver is tied to low output voltage, in turn, results in faster turn-off switching speed, including accelerated $v_{ds}$ voltage rising rate, i.e., $(t_4-t_3)<(t_{4x}-t_3)$, and accelerated $i_d$ current falling rate, i.e., $(t_5-t_4)<(t_{5x}-t_{4x})$. "Voltage rising rate" means the $v_{ds}$ voltage rising rate, which is the slew rate of $v_{ds}$ voltage during its rising interval. "Current falling rate" means the $i_d$ current falling rate, which is the slew rate of $i_d$ current during its falling interval. The fastest turn-off switching speed is expressed by the minimum $v_{ds}$ voltage rising time and the minimum $i_d$ current falling time derived in equations (11)-(12), below, while the slowest turn-off switching speed is expressed by the maximum $v_{ds}$ voltage rising time and the maximum $i_d$ current falling time derived in equations (13)-(14), below. The "faster" speed here means it is closer to the fastest turn-off switching speed.

Taking the fast switching waveforms shown in FIG. 4 as an example, equivalent circuits corresponding to each subinterval during the turn-off process are depicted in FIGS. 5A-5E, and the operation during the turn-off process is briefly explained below.

Figure 5A:
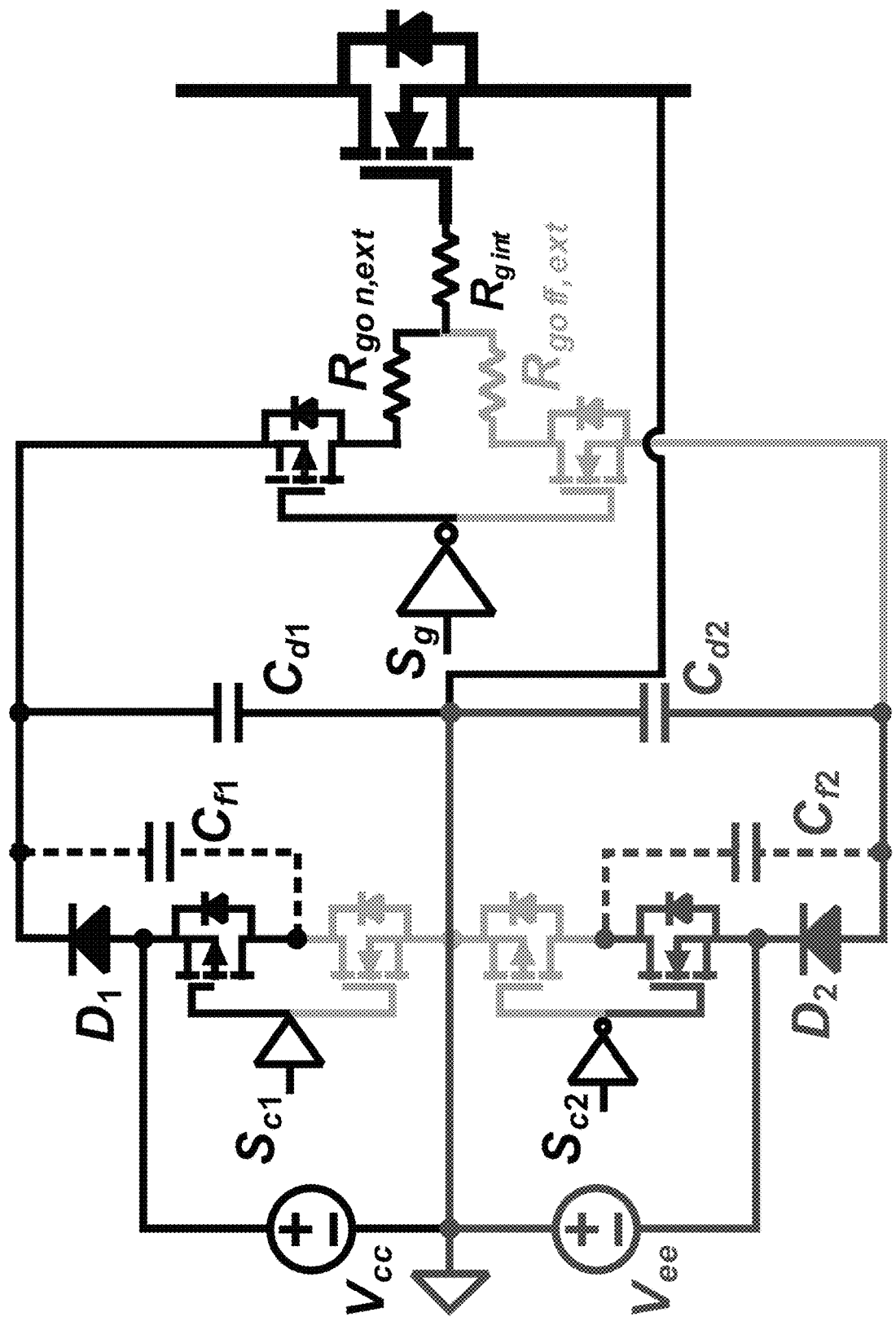
FIGS. 5A-5E illustrate equivalent circuits corresponding to subintervals during the turn-off process of a CPGD.

FIG. 5A illustrates the subinterval before $t_0$. $S_{c2}$ remains at the low level and $S_g$ remains at the high level. $C_{f2}$ is fully discharged (during the steady ON state of power device) and clamped by $D_2$. $C_{d2}$ is clamped by $V_{ee}$ through $D_2$. During this subinterval, $v_{Cf2}=-V_{df}$ and $v_{Cd2}=V_-=V_{ee}-V_{df}$.

Figure 5B:
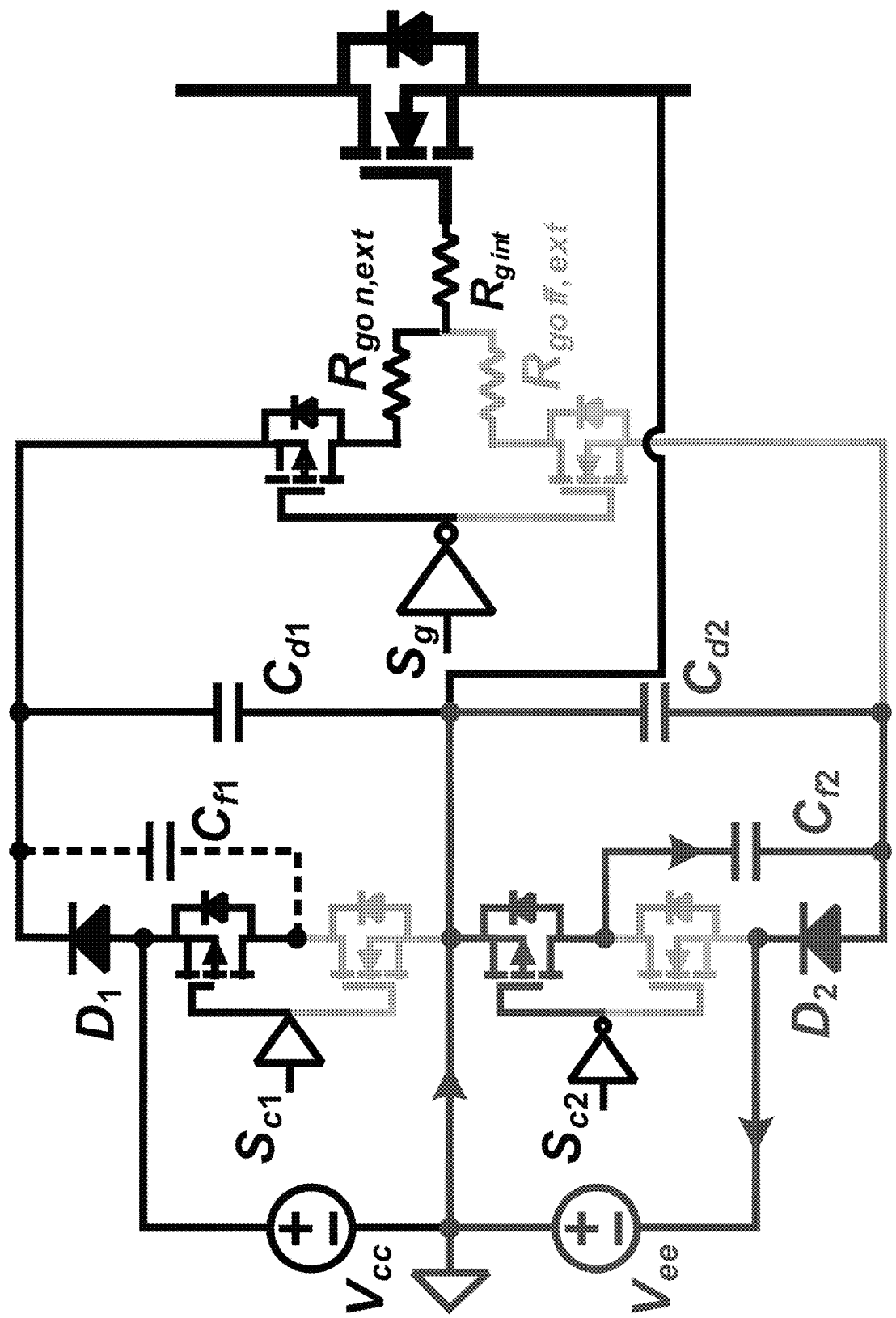

FIG. 5B illustrates the subinterval $[t_0-t_1]$. At to, Sa changes to the high level, initiating the pre-charging of $C_{f2}$ through $D_2$ using $V_{ee}$ supply. This pre-charging continues until or complete before $t_1$. During this subinterval, $v_{Cf2}$ increases and $v_{Cd2}$ remains unchanged.

Figure 5C:
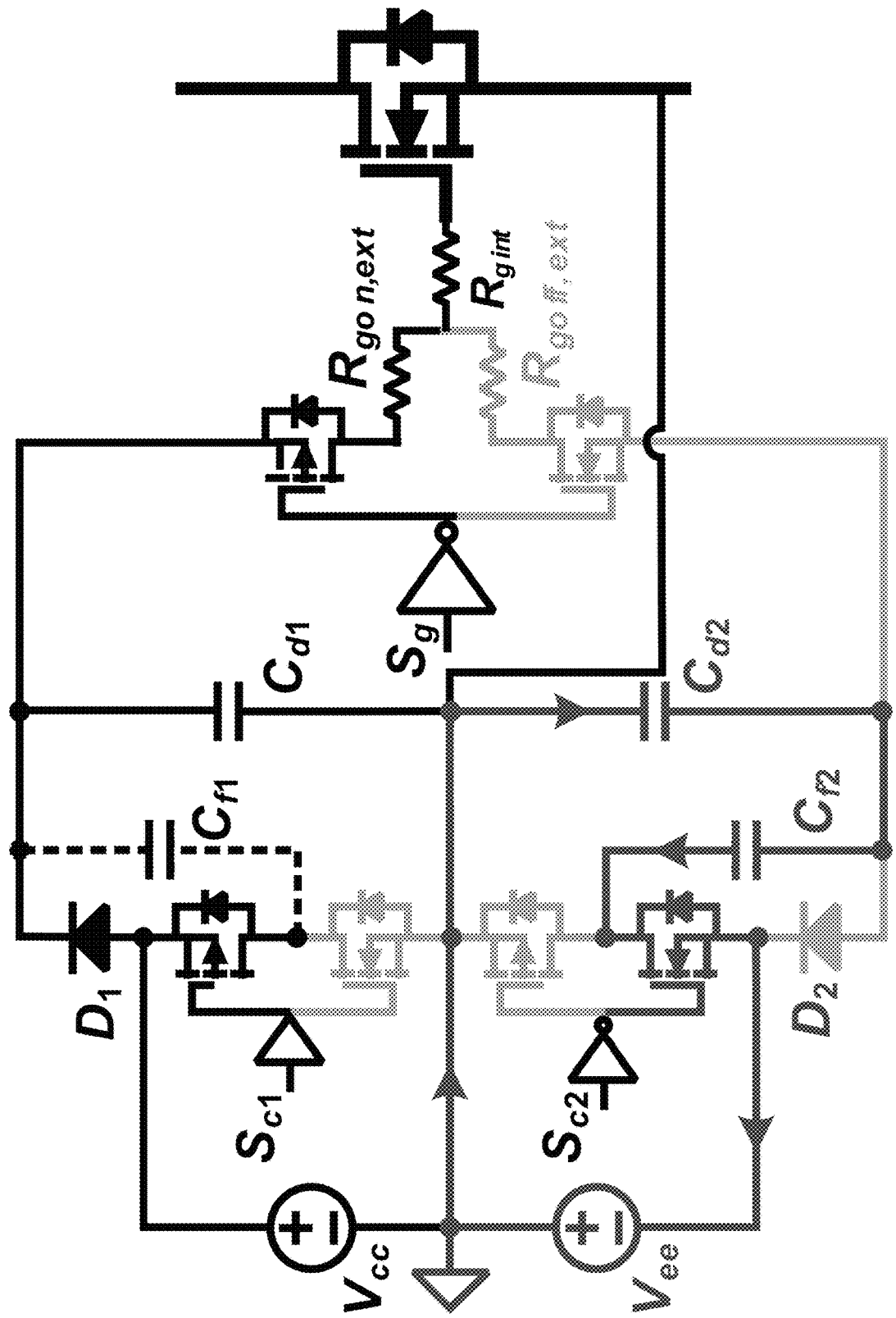

FIG. 5C illustrates the subinterval $[t_1-t_2]$. At $t_1$, $S_{c2}$ changes to the low level, allowing $C_{f2}$ is series with $V_{ee}$ supply to charge $C_{d2}$, $v_{Cd2}$ therefore increases and reaches the "negative" pump voltage (i.e., $V_{Cd2,th1}$ shown in FIG. 4) at $t_2$. Due to the charge transfer mechanism, $v_{Cf2}$ decreases, and the difference between $v_{Cf2}$ and $v_{Cd2}$ reaches a level of $V_{ee}$ at $t_2$.

Figure 5D:
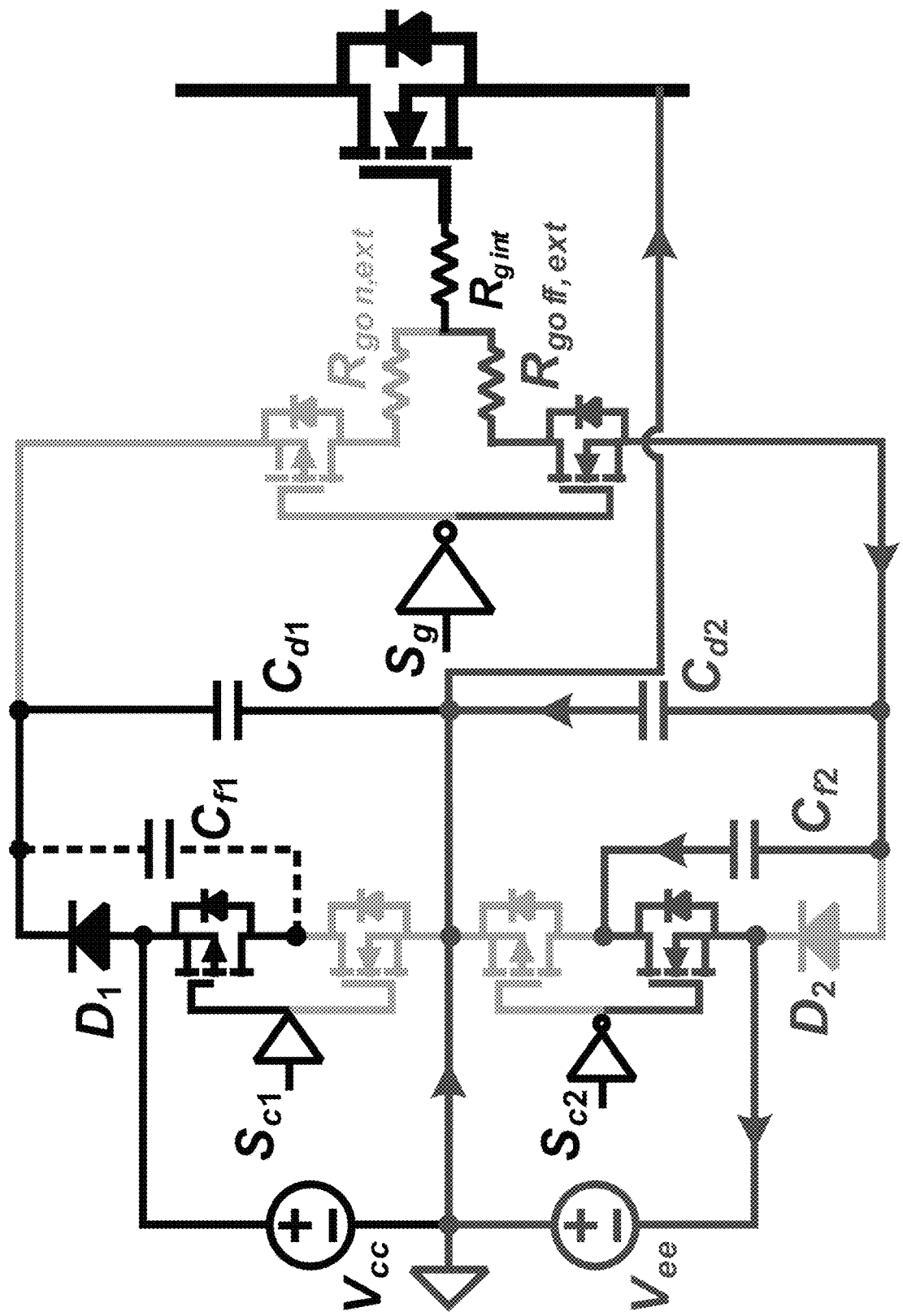

FIG. 5D illustrates the subinterval $[t_2-t_6]$. At $t_2$, $S_g$ changes to the low level, resulting in the discharging of both $C_{d2}$ and $C_{f2}$. This discharging process provides the gate current to discharge $C_{gs}$ of power device. During this subinterval, $v_{gs}$ decreases, ultimately reaching $V_{miller}$ of power device at $t_3$. Following $t_3$, $v_{ds}$ of power device starts to rise until it reaches its peak value at $t_4$. Following $t_4$, $i_d$ of power device starts to fall, reaching zero at $t_5$ when $v_{gs}$ reaches $V_{th}$. After $t_5$, $v_{gs}$ continues to fall until it reaches the steady-state value of $V_{0-}$ at $t_6$. During this subinterval, both $v_{Cf2}$ and $v_{Cd2}$ decrease and subsequently are fully discharged at $t_6$, that is $v_{Cf2}=-V_{df}$ and $v_{Cd2}=V_{0-}$.

Figure 5E:
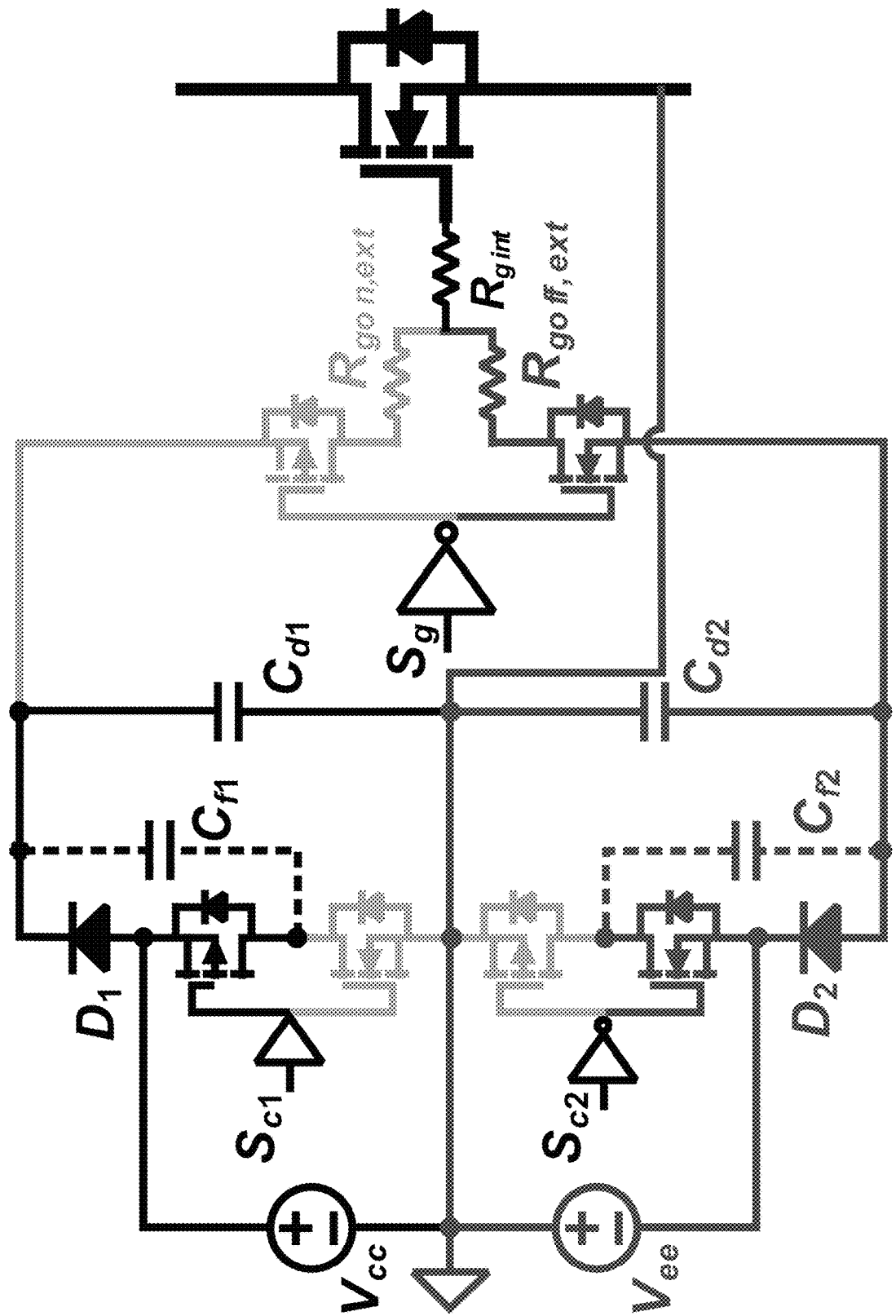

FIG. 5E illustrates the subinterval after $t_6$. $D_2$ conducts, causing both $v_{Cd2}$ and $v_{gs}$ to be clamped by $V_{ee}$ supply through $D_2$, which remains during rest of the steady OFF state of power device.

The design equations for $C_{f1}$, $C_{da}$, $C_{f2}$ and $C_{d2}$ are illustrated as follows for selecting proper capacitance for $C_{f1}$, $C_{d1}$, $C_{f2}$ and $C_{d2}$ for the disclosed CPGD 100.

To prevent the overcharging issue, the selection of $C_{f1}$ should guarantee that the maximum pre-charged charge of $C_{f1}$ during subinterval $[t_0-t_1]$ aligns with the total gate charge needed for the power device during the turn-on process, which can be determined as (1).

$$C_{f1} = \frac{C_{gs}(V_{cc} + V_{ee} - 2V_{df}) + Q_{gd}}{V_{cc}} \quad (1)$$

where $Q_{gd}$ is the equivalent gate-to-drain charge of SiC MOSFET at $V_{dc}$.

The value of $C_{d1}$ determines the maximum "positive" pump voltage, $V_{Cd1,max}$, which can be determined by (2) based on the charge conservation.

$$C_{d1} = C_1 \left( \frac{V_{cc}}{V_{Cd1,max} - V_{cc} + V_{df}} - 1 \right) \quad (2)$$

where $V_{Cd1,max}$ is determined based on the desired maximum turn-on switching speed in real applications.

To prevent the overcharging issue, the selection of $C_{f2}$ should guarantee that the maximum pre-charged charge of $C_{f2}$ during subinterval $[t_0-t_1]$ aligns with the total gate charge needed for the power device during the turn-off process, which can be determined as (3).

$$C_{f2} = \frac{C_{gs}(V_{cc} + V_{ee} - 2V_{df}) + Q_{gd}}{V_{ee}} \quad (3)$$

The value of $C_{d2}$ determines the maximum "negative" pump voltage, $V_{Cd2,max}$, which can be determined by (4) based on the charge conservation.

$$C_{d2} = C_{f2} \left( \frac{V_{ee}}{V_{Cd2,max} - V_{ee} + V_{df}} - 1 \right) \quad (4)$$

$V_{Cd2,max}$ is determined based on the desired maximum turn-off switching speed in real applications.

Given the selected $C_{f1}$, $C_{d1}$, $C_{f2}$ and $C_{d2}$ the "positive" and "negative" pump voltage, $V_{Cd1}$ and $V_{Cd2}$, are determined by the pulse widths assigned to $S_{c1}$ and $S_{c2}$. The actual $V_{Cd1}$ and $V_{Cd2}$ determine the turn-on and turn-off switching speed of power device, respectively.

The actual turn-on switching speed of power device depends on the relationship of actual $V_{Cd1}$ and the derived threshold pump voltages in (5).

$$\begin{cases} V_{Cd1,th1} = \frac{C_{gs}(V_{cc} + V_{ee} - 2V_{df}) + Q_{gd}}{C_{f1} + C_{d1}} + (V_{cc} - V_{df}) \\ V_{Cd1,th2} = \frac{C_{gs}(V_{miller} + V_{ee} - V_{df}) + Q_{gd}}{C_{f1} + C_{d1}} + (V_{cc} - V_{df}) \\ V_{Cd1,th3} = \frac{C_{gs}(V_{miller} + V_{ee} - V_{df})}{C_{f1} + C_{d1}} + (V_{cc} - V_{df}) \\ V_{Cd1,th4} = \frac{C_{gs}(V_{th} + V_{ee} - V_{df})}{C_{f1} + C_{d1}} + (V_{cc} - V_{df}) \\ V_{Cd1,th5} = (V_{cc} - V_{df}) \end{cases} \quad (5)$$

where $V_{miller} = i_{load}/g_{fs}$. $i_{load}$ is the load current and $g_{fs}$ is the transconductance of power device.

If $V_{Cd1} = V_{Cd1,th1}$, the maximum turn-on switching speed is achieved. This results in the minimum turn-on delay time, i.e., $(t_3-t_2)$, and the maximum values for $i_d$ current rising rate, $v_{ds}$ voltage falling rate, and $v_{gs}$ voltage rising rate after the Miller plateau.

If $V_{Cd1,th2} \leq V_{Cd1} < V_{Cd1,th1}$, the turn-on delay time, $i_d$ current rising rate and $v_{ds}$ voltage falling rate undergo the full acceleration. The $v_{gs}$ voltage rising rate after the Miller plateau undergoes a partial acceleration, and it remains consistent with that of conventional VSGD once $V_{Cd1} = V_{Cd1,th1}$.

If $V_{Cd1,th3} \leq V_{Cd1} < V_{Cd1,th2}$, both the turn-on delay time, and $i_d$ current rising rate undergo the full acceleration, while the $v_{gs}$ voltage rising rate after the Miller plateau remains consistent with that of the conventional VSGD. The $v_{ds}$ voltage falling rate undergoes a partial acceleration, and it remains consistent with that of conventional VSGD once $V_{Cd1} = V_{Cd1,th3}$.

If $V_{Cd1,th4} \leq V_{Cd1} < V_{Cd1,th3}$, only the turn-on delay time undergoes the full acceleration, while the $v_{gs}$ voltage rising rate after the Miller plateau and the $v_{ds}$ voltage falling rate remain consistent with that of the conventional VSGD. The $i_d$ current rising rate undergoes a partial acceleration, and it remains consistent with that of the conventional VSGD once $V_{Cd1} = V_{Cd1,th4}$.

If $V_{Cd1,th5} \leq V_{Cd1} < V_{Cd1,th4}$, the minimum turn-on switching speed is achieved, which aligns with the performance of conventional VSGD, This results in the minimum values for $i_d$ current rising rate, $v_{ds}$ voltage falling rate, and $v_{gs}$ voltage rising rate after the Miller plateau. While the turn-on delay time undergoes a partial acceleration, it remains consistent with that of the conventional VSGD once $V_{Cd1} = V_{Cd1,th5}$.

The turn-on switching waveforms of CPGD 100 with different $V_{Cd1}$ are compared in FIGS. 6A-6D, Please note that the dashed lines depicted in FIGS. 6A-6D represent waveforms attributed to the conventional VSGD, serving as a reference for comparison.

Figure 6A:
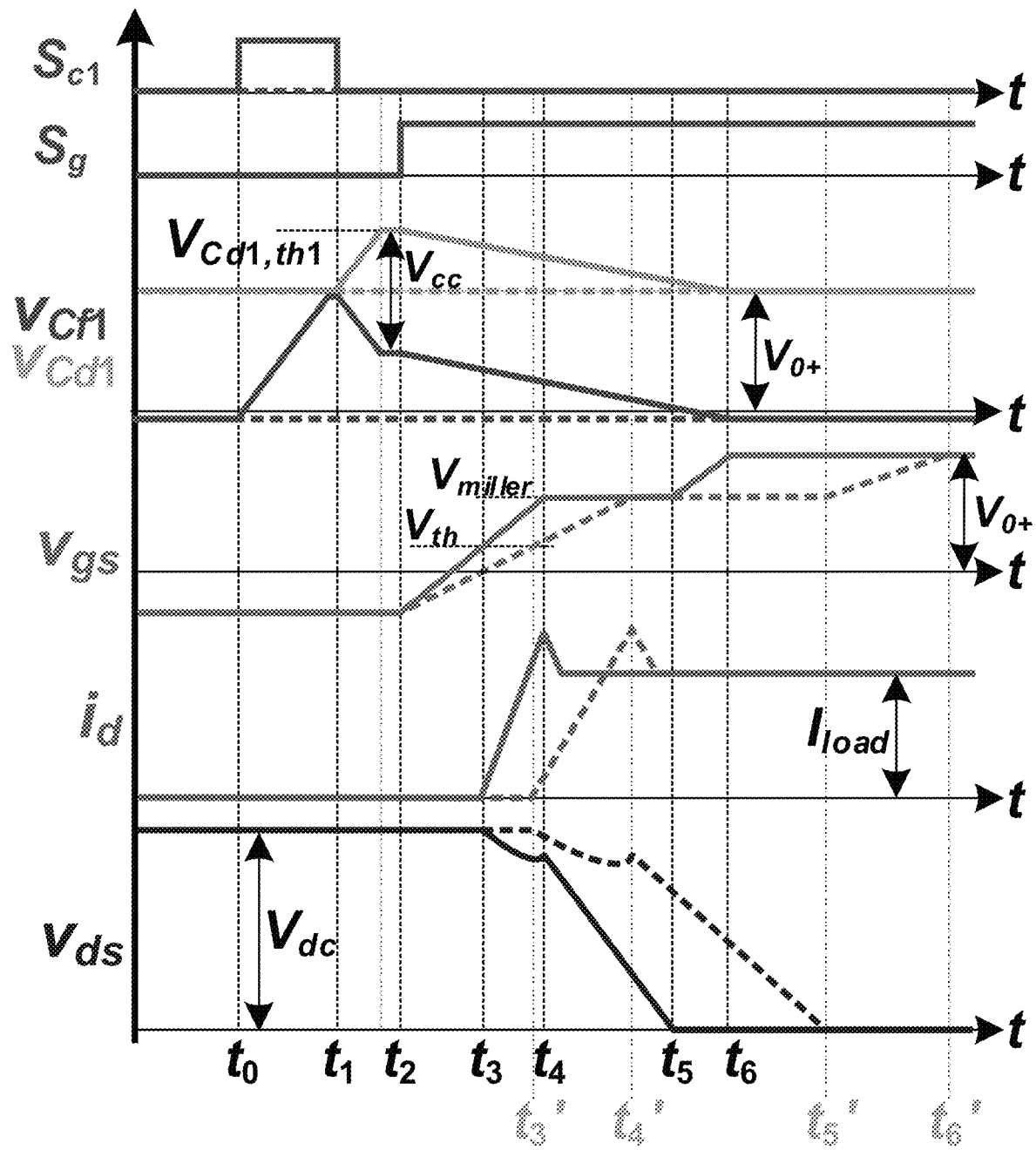
FIGS. 6A-6D illustrate turn-on switching waveforms of a CPGD with different $V_{Cd1}$ ($V_{Cd1}$ is the "positive" pump voltage across totem-pole driver decoupling capacitor $C_{d1}$.
Figure 6B:
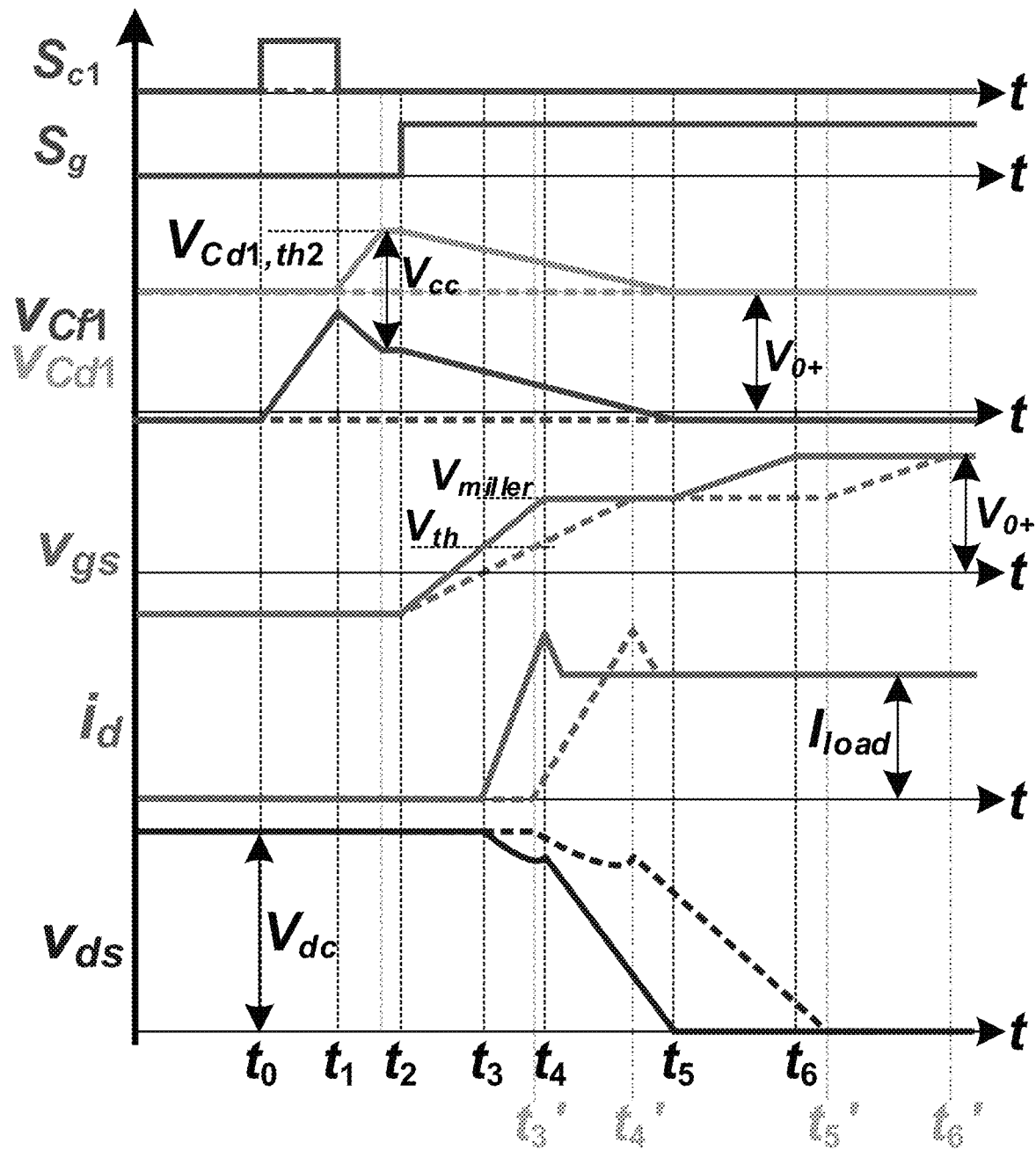
Figure 6C:
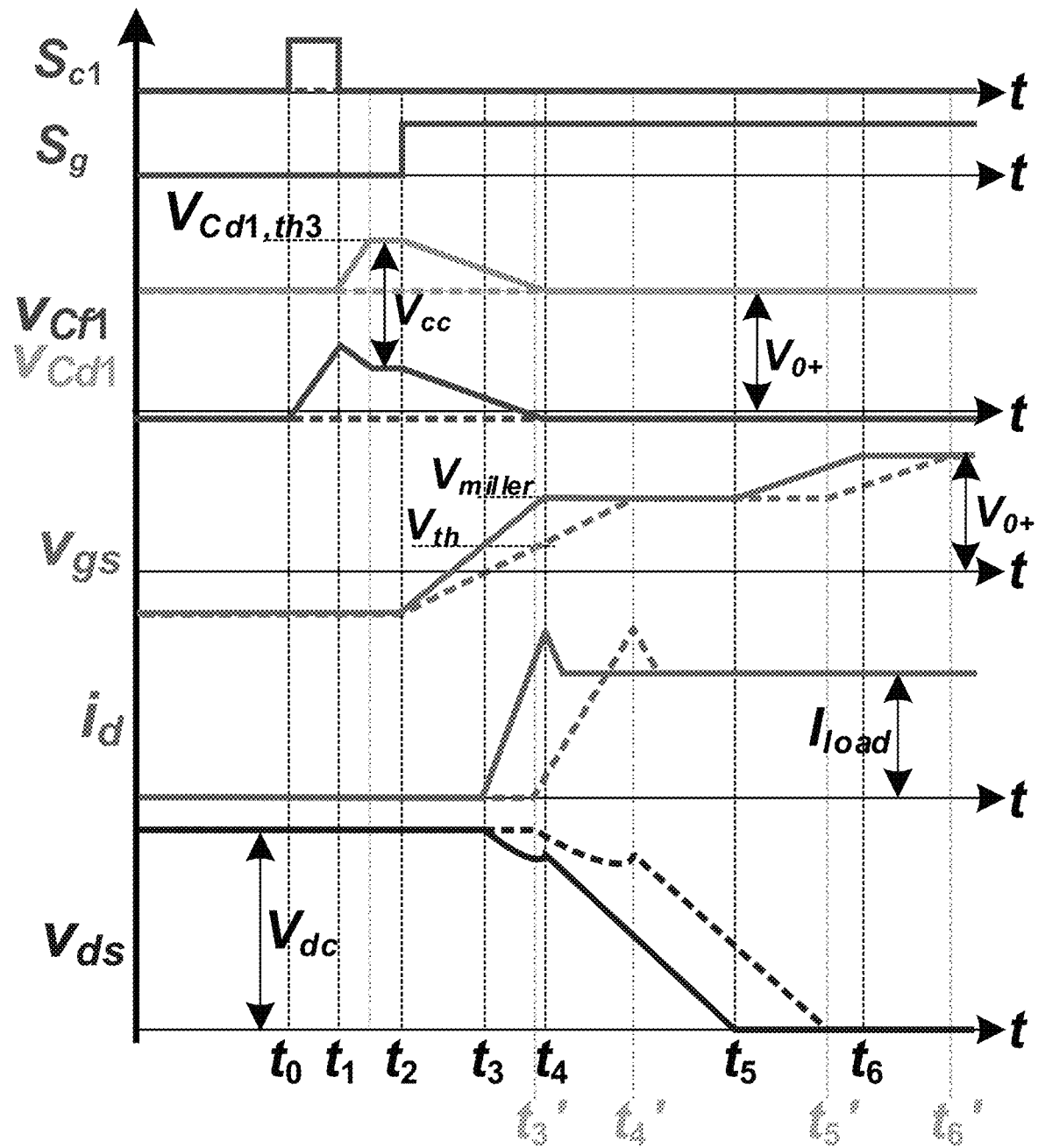
Figure 6D:
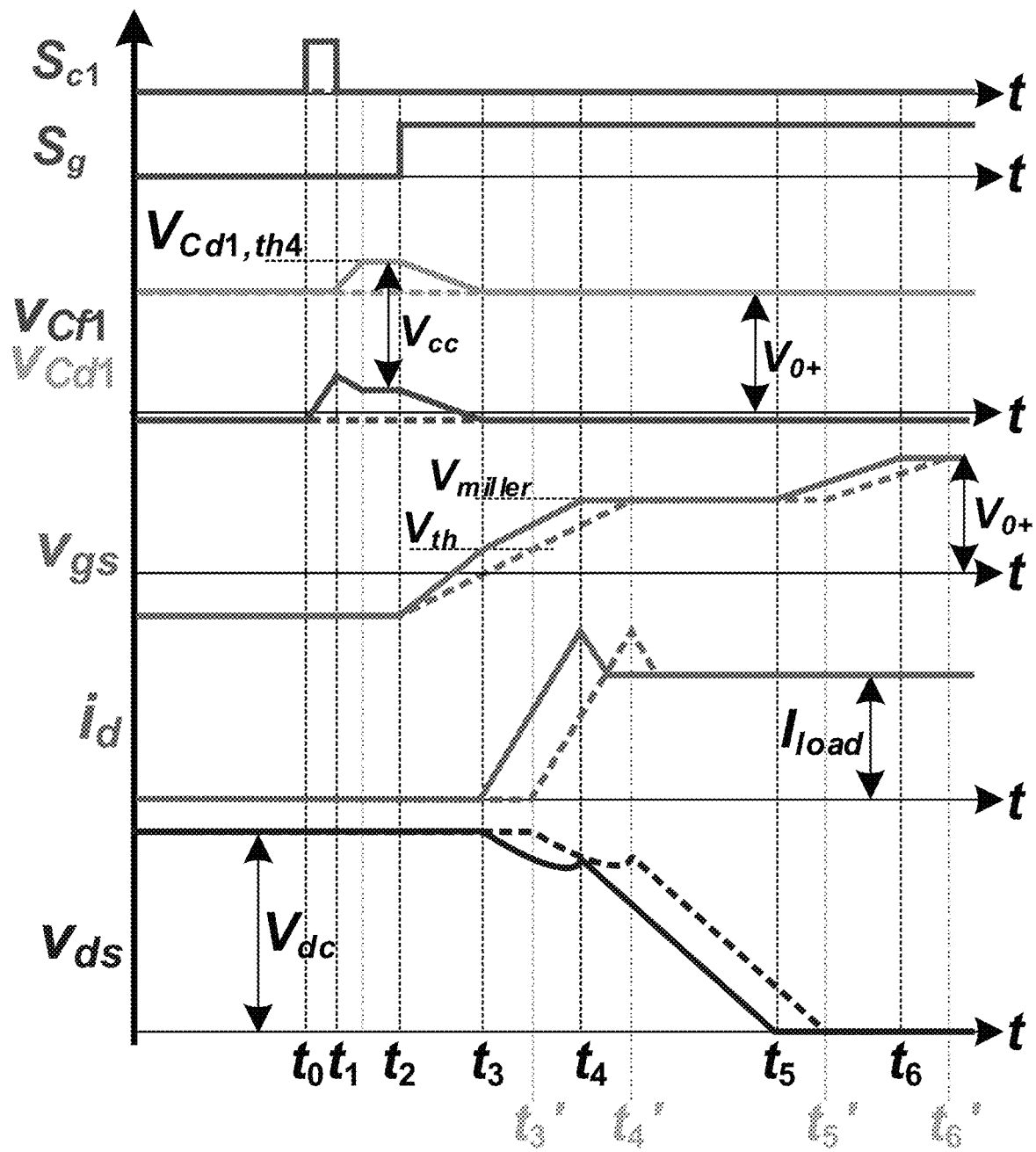

In FIG. 6A, $V_{Cd1} = V_{Cd1,th1}$.
In FIG. 6B, $V_{Cd1} = V_{Cd1,th2}$.
In FIG. 6C, $V_{Cd1} = V_{Cd1,th3}$.
In FIG. 6D, $V_{Cd1} = V_{Cd1,th4}$.

As previously discussed, the maximum turn-on switching speed occurs when $V_{Cd1} = V_{Cd1,th1}$, while the minimum turn-on switching speed occurs when $V_{Cd1} < V_{Cd1,th4}$.

The maximum turn-on switching speed can be calculated as (6)-(7):

$$\begin{cases} t_{cr,min} = \\ R_{gon} C_{e1} \ln \frac{(C_{e1}(V_{Cd1,th1} + V_{ee} - V_{df}) - C_{gs}(V_{th} + V_{ee} - V_{df}))}{(C_{e1}(V_{Cd1,th1} + V_{ee} - V_{df}) - C_{gs}(V_{miller} + V_{ee} - V_{df}))}, \\ C_{e1} = \frac{(C_{f1} + C_{d1})C_{gs}}{C_{f1} + C_{d1} + C_{gs}} \end{cases} \quad (6)$$

-continued $$t_{vf,min} = R_{gon}(C_{f1} + C_{d1}) \ln \frac{1}{1 - \frac{Q_{gd}}{(C_{d1} + C_{f1})(V_{Cd1,th1} - V_{miller}) - C_{gs}(V_{miller} + V_{ee} - V_{df})}} \quad (7)$$

where $t_{cr,min}$ is the minimum $i_d$ current rising time, $t_{vf,min}$ is the minimum $v_{ds}$ voltage falling time, and $R_{gon} = R_{g,int} + R_{gpn,ext}$.

The minimum turn-on switching speed can be calculated as (8)-(9):

$$t_{cr,max} = R_{gon} C_{gs} \ln \frac{V_{cc} - V_{df} - V_{th}}{V_{cc} - V_{df} - V_{miller}} \quad (8)$$

$$t_{vf,max} = R_{gon} \frac{Q_{gd}}{V_{cc} - V_{df} - V_{miller}} \quad (9)$$

where $t_{cr,max}$ is the maximum $i_d$ current rising time, $t_{vf,max}$ is the maximum $v_{ds}$ voltage falling time, and $V_{dc}$ is the dc-link voltage.

The actual turn-off switching speed of power device depends on the relationship of actual $V_{Cd2}$ and the derived threshold pump voltages in (10):

$$\begin{cases} V_{Cd2,th1} = \frac{C_{gs}(V_{cc} + V_{ee} - 2V_{df}) + Q_{gd}}{C_{f2} + C_{d2}} + (V_{ee} - V_{df}) \\ V_{Cd2,th2} = \frac{C_{gs}(V_{cc} - V_{df} - V_{th}) + Q_{gd}}{C_{f2} + C_{d2}} + (V_{ee} - V_{df}) \\ V_{Cd2,th3} = \frac{C_{gs}(V_{cc} - V_{df} - V_{th}) + Q_{gd}}{C_{f2} + C_{d2}} + (V_{ee} - V_{df}) \\ V_{Cd2,th4} = \frac{C_{gs}(V_{cc} - V_{df} - V_{th}) + Q_{gd}}{C_{f2} + C_{d2}} + (V_{ee} - V_{df}) \\ V_{Cd2,th5} = (V_{ee} - V_{df}) \end{cases} \quad (10)$$

If $V_{Cd2} = V_{Cd2,th1}$, the maximum turn-on switching speed is achieved. This results in the minimum turn-on delay time, i.e., ($t_3$-$t_2$), and the maximum values for $i_d$ current rising rate, $i_d$ current falling rate, and $v_{gs}$ voltage falling rate reaching $V_{th}$.

If $V_{Cd2,th2} \leq V_{Cd2} < V_{Cd2,th1}$, the turn-on delay time, $v_{ds}$ voltage falling rate undergo the full acceleration. The $v_{gs}$ voltage rising rate after reaching $V_{th}$ undergoes a partial acceleration, and it remains consistent with that of conventional VSGD once $V_{Cd2} = V_{Cd2,th2}$.

If $V_{Cd2,th3} \leq V_{Cd2} < V_{Cd2,th3}$, both the turn-off delay time, and $v_{ds}$ voltage rising rate undergo the full acceleration, while the $v_{gs}$ voltage falling rate after reaching $V_{th}$ remains consistent with that of the conventional VSGD. The $i_d$ current falling rate undergoes a partial acceleration, and it remains consistent with that of conventional VSGD once $V_{Cd2} = V_{Cd2,th3}$.

If $V_{Cd2,th3} \leq V_{Cd2} < V_{Cd2,th3}$, only the turn-on delay time undergoes the full acceleration, while the $v_{gs}$ voltage falling rate after reaching $V_{th}$ and the $i_d$ current falling rate remain consistent with that of the conventional VSGD. The $i_d$ current rising rate undergoes a partial acceleration, and it remains consistent with that of conventional VSGD once $V_{Cd1} = V_{Cd1,th4}$.

If $V_{Cd2,th5} \leq V_{Cd2} < V_{Cd2,th4}$, the minimum turn-on switching speed is achieved, which aligns with the performance of conventional VSGD. This results in the minimum values for $v_{ds}$ voltage rising rate, $i_d$ current falling rate, and $v_{gs}$ voltage falling rate after reaching $V_{th}$. While the turn-on delay time undergoes a partial acceleration, it remains consistent with that of conventional VSGD once $V_{Cd2} = V_{Cd2,th5}$.

The turn-off switching waveforms of CPGD 100 with different $V_{Cd2}$ are compared in FIGS. 7A-7D. Please note that the dashed lines depicted in FIG. 7A-7D represent waveforms attributed to the conventional VSGD, serving as a reference for comparison.

Figure 7A:
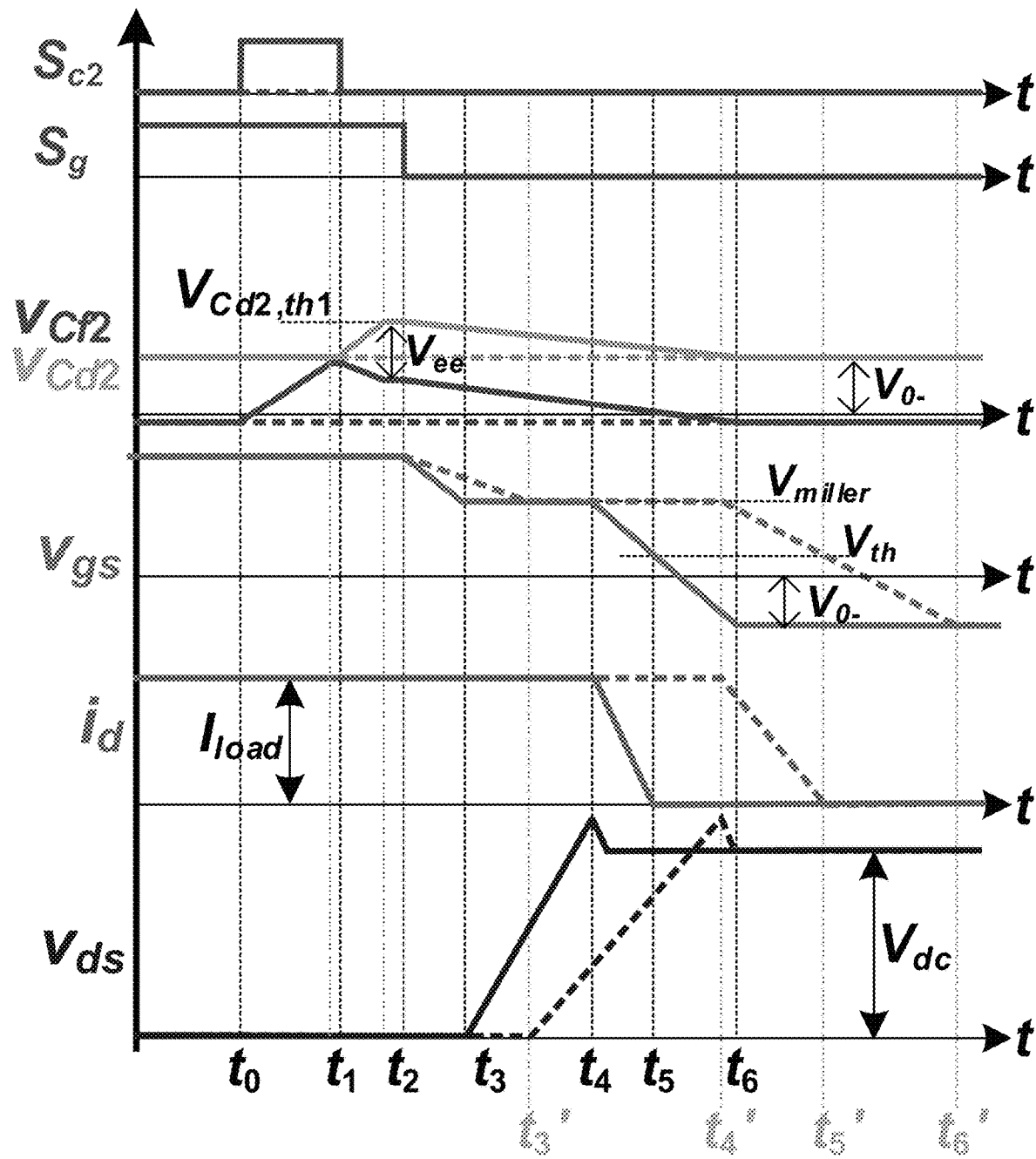
FIGS. 7A-7D illustrate turn-off switching waveforms of a CPGD with different $V_{Cd2}$ ($V_{Cd2}$ is the "negative" pump voltage across totem-pole driver decoupling capacitor $C_{d2}$).
Figure 7B:
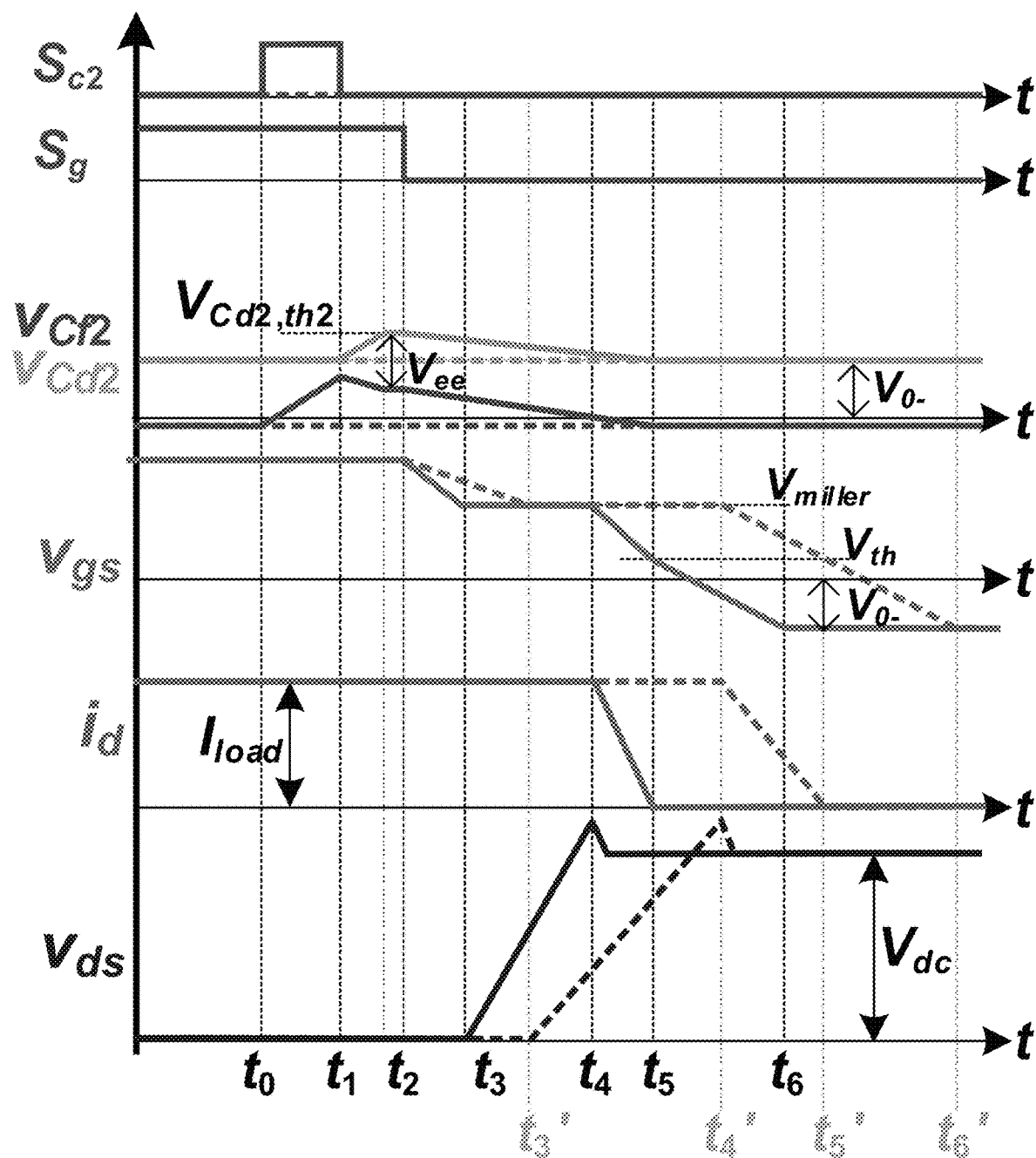
Figure 7C:
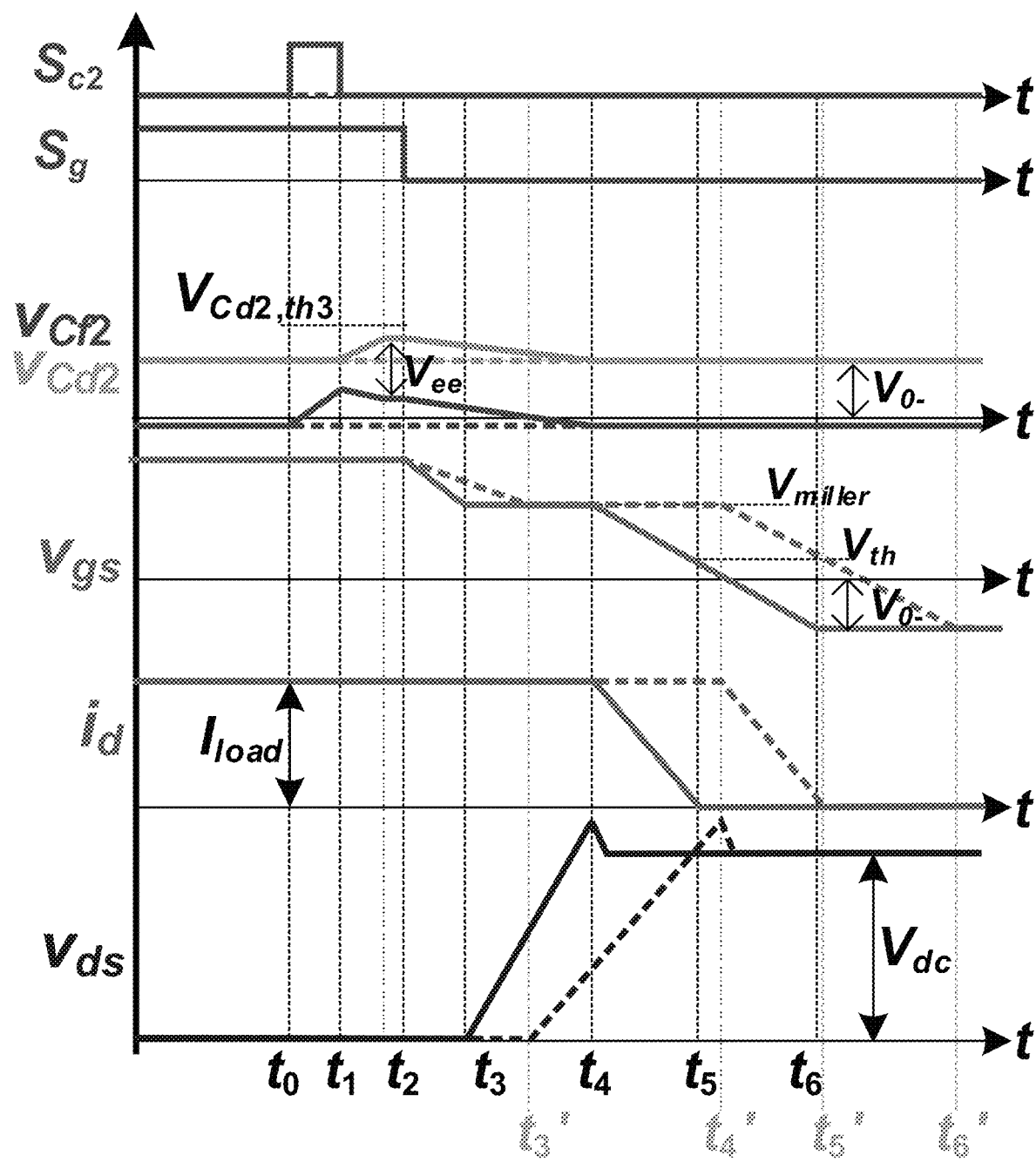
Figure 7D:
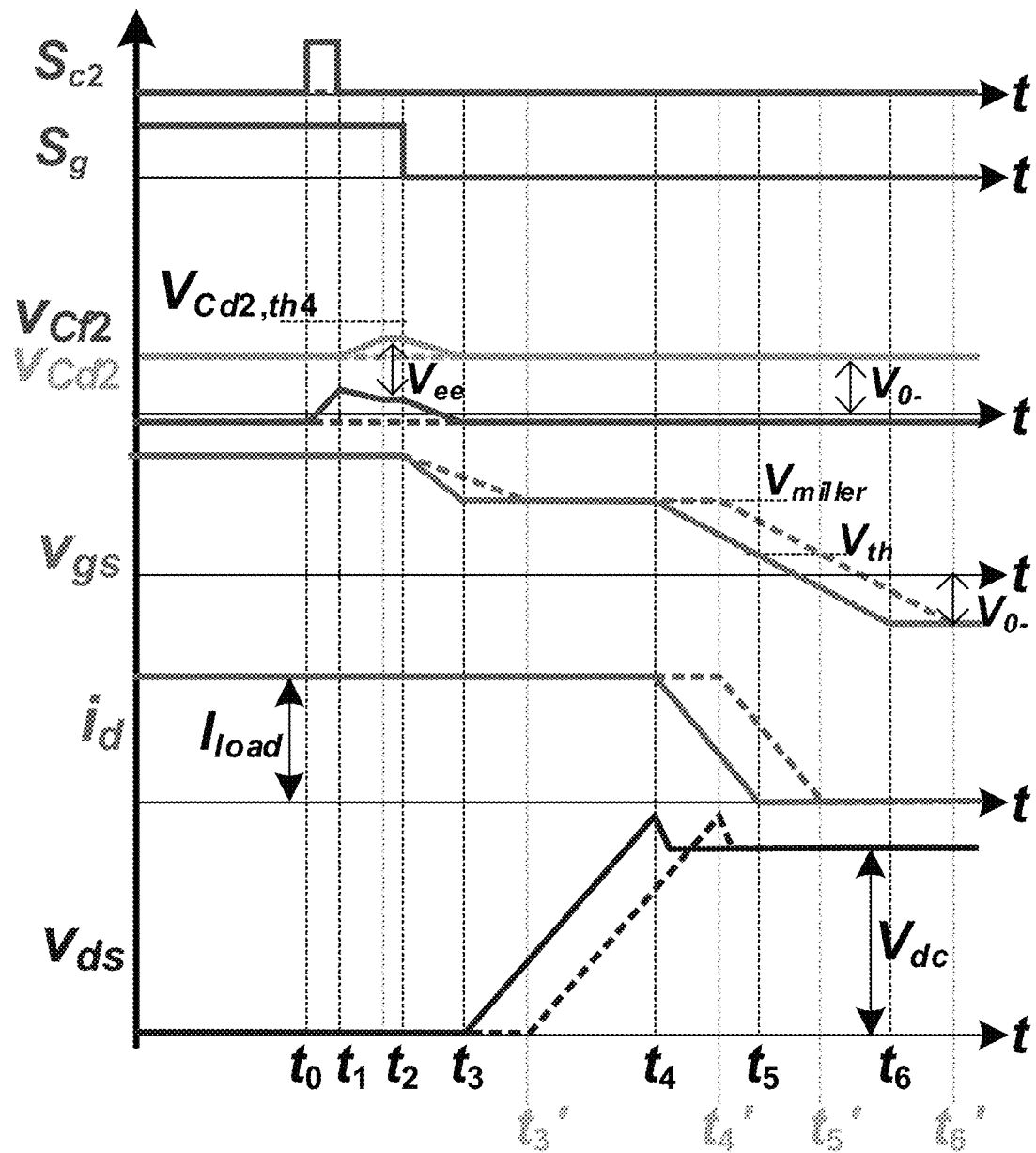

In FIG. 7A, $V_{Cd2} = V_{Cd2,th1}$.
In FIG. 7B, $V_{Cd2} = V_{Cd2,th2}$.
In FIG. 7C, $V_{Cd2} = V_{Cd2,th3}$.
In FIG. 7D, $V_{Cd2} = V_{Cd2,th4}$.

As previously discussed, the maximum turn-off switching speed occurs when $V_{Cd2} = V_{Cde,th1}$, while the minimum turn-off switching speed occurs when $V_{Cd2} < V_{Cde,th4}$.

The maximum turn-off switching speed can be calculated as (11)-(12):

$$t_{vr,min} = R_{goff}(C_{f2} + C_{d2}) \ln \frac{1}{1 - \frac{Q_{gd}}{(C_{d2} + C_{f2})(V_{Cd2,th1} + V_{miller}) - C_{gs}(V_{cc} - V_{df} - V_{miller})}} \quad (11)$$

$$\begin{cases} t_{cf,min} = R_{goff} C_{e2} \ln \frac{1}{1 - \frac{C_{gs}(V_{miller} - V_{th})}{C_{e2}(V_{Cd2,th1} + V_{miller}) - \frac{C_{e2}}{C_{d2} + C_{f2}}(C_{gs}(V_{cc} - V_{df} - V_{miller}) + Q_{gd})}} \\ C_{e2} = \frac{(C_{f2} + C_{d2})C_{gs}}{C_{f2} + C_{d2} + C_{gs}} \end{cases} \quad (12)$$

where $t_{vr,min}$ is the minimum $v_{ds}$ voltage rising time, $t_{cf,min}$ is the minimum $i_d$ current falling time, and $R_{goff} = R_{g,int} + R_{goff,ext}$.

The minimum turn-off switching speed can be calculated as (13)-(14):

$$t_{vr,max} = R_{goff} \frac{Q_{gd}}{V_{ee} - V_{df} + V_{miller}} \quad (13)$$

$$t_{cf,max} = R_{goff} C_{gs} \ln \frac{V_{miller} + V_{ee} - V_{df}}{V_{th} + V_{ee} - V_{df}} \quad (14)$$

where $t_{vr,max}$ is the maximum $v_{ds}$ voltage rising time, $t_{cf,max}$ is the maximum $i_d$ current falling time.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A charge pump gate driver (CPGD) circuit with an adjustable pump voltage for active dv/dt control, comprising:
  a first power supply that provides a positive voltage reference;
  a second power supply that provides a negative voltage reference;
  a first charge pump, wherein the first charge pump controls a turn-on switching speed of a power device, said first charge pump comprising two MOSFETSs, one diode ($D_1$), and one flying capacitor ($C_{f1}$);
  a second charge pump, wherein the second charge pump controls a turn-off switching speed of the power device, said second charge pump comprising two MOSFETS, one diode ($D_2$), and one flying capacitor ($C_{f2}$); and
  a totem-pole driver comprising two decoupling capacitors ($C_{d1}$ and $C_{d2}$) and split outputs to connect external ON and OFF gate resistors of the power device to the CPGD circuit,
  wherein during a turn-on process a pulse width of a control signal ($S_{c1}$) of the first charge pump is adjusted so that the flying capacitor ($C_{f1}$) of the first charge pump is pre-charged to varying levels, allowing a voltage ($v_{Cf1}$) across the flying capacitor ($C_{f1}$) of the first charge pump to attain different magnitudes at a first time period ($t_1$), then, a first one of the decoupling capacitors ($C_{d1}$) of the totem-pole driver is charged by discharging the flying capacitor ($C_{f1}$) of the first charge pump, which in turn pumps a voltage ($v_{Cd1}$) across the first one of the decoupling capacitors ($C_{d1}$) of the totem-pole driver to varying voltage levels during a second time subinterval [$t_1$~$t_2$], wherein a different pump voltage of the voltage across the first one of the decoupling capacitors ($C_{d1}$) of the totem-pole driver at time period $t_2$ leads to a varying gate current of the power device after the totem-pole driver is tied to a high output voltage at $t_2$, providing different current rising rate and voltage falling rate of the power device, resulting in a faster switching speed, including an accelerated current rising rate, i.e., ($t_4$-$t_3$)<($t_{4x}$-$t_3$), and an accelerated voltage falling rate, i.e., ($t_5$-$t_4$)<($t_{15x}$-$t_{4x}$) of the power device,
  wherein during a turn-off process a pulse width of a control signal ($S_{c2}$) is adjusted so that the flying capacitor ($C_{f2}$) of the second charge pump is pre-charged to varying levels, allowing a voltage ($v_{Cf2}$) across the flying capacitor ($C_{f2}$) of the second charge pump to attain different magnitudes at a first time period ($t_1$), then a second one of the decoupling capacitors ($C_{d2}$) of the totem-pole driver is charged by discharging the flying capacitor ($C_{f2}$) of the second charge pump, which in turn pumps a voltage ($v_{Cd2}$) across the second one of the decoupling capacitors ($C_{d2}$) of the totem-pole driver to varying voltage levels during a second time subinterval [$t_1$~$t_2$], wherein a different pump voltage of the voltage ($v_{Cd2}$) across the second one of the decoupling capacitors ($C_{d2}$) of the totem-pole driver at $t_2$ leads to a varying gate current of the power device after the totem-pole driver is tied to a low output voltage at $t_2$, providing different voltage rising rate and current falling rate of the power device, resulting in a faster switching speed, including an accelerated voltage rising rate, i.e., ($t_4$-$t_3$)<($T_{4X}$-$t_3$), and an accelerated current falling rate, i.e., ($t_5$-$t_4$)<($t_{15x}$-$t_{4x}$), and
  wherein to prevent an overcharging issue, a value of $C_{f1}$ is selected to guarantee that a maximum pre-charged charge of $C_{f1}$ during a time subinterval [$t_0$-$t_1$] aligns with a total gate charge needed for the power device during the turn-on process, which is determined by:

$$C_{f1} = \frac{C_{gs}(V_{cc} + V_{ee} - 2V_{df}) + Q_{gd}}{V_{cc}}$$

where $Q_{gd}$ is an equivalent gate-to-drain charge of SiC MOSFET at $V_{dc}$.

2. The CPGD circuit of claim 1, wherein the power device comprises wide bandgap devices, including SiC MOSFETs and GaN HEMTs.

3. The CPGD circuit of claim 2, wherein the power device comprises a SiC MOSFET.

4. The CPGD circuit of claim 1, wherein a value of $C_{d1}$ determines a maximum "positive" pump voltage, $V_{Cd1,max}$, which is determined by:

$$C_{d1} = C_{f1}\left(\frac{V_{cc}}{V_{Cd1,max} - V_{cc} + V_{df}} - 1\right)$$

where $V_{Cd1,max}$ is determined based on a desired maximum turn-on switching speed.

5. The CPGD circuit of claim 4, wherein to prevent an overcharging issue, a value of $C_{f2}$ is select to guarantee that a maximum pre-charged charge of $C_{f2}$ during a time subinterval [$t_0$-$t_1$] aligns with a total gate charge needed for the power device during the turn-off process, which is determined as:

$$C_{f2} = \frac{C_{gs}(V_{cc} + V_{ee} - 2V_{df}) + Q_{gd}}{V_{ee}}$$

where $Q_{gd}$ is an equivalent gate-to-drain charge of SiC MOSFET at $V_{dc}$.

6. The CPGD circuit of claim 5, wherein a value of Caz determines a maximum "negative" pump voltage, $V_{Cd2,max}$, which is determined by:

$$C_{d2} = C_{f2}\left(\frac{V_{ee}}{V_{Cd2,max} - V_{ee} + V_{df}} - 1\right)$$

where $V_{Cd2,max}$ is determined based on a desired maximum turn-off switching speed.

7. The CPGD circuit of claim 6, wherein given the selected $C_{f1}$, $C_{d1}$, $C_{f2}$ and $C_{d2}$, the "positive" and "negative" pump voltage, $V_{Cd1}$ and $V_{Cd2}$, are determined by pulse widths assigned to $S_{c1}$ and $S_{c2}$ and actual values of $V_{Cd1}$ and $V_{Cd2}$ determine the turn-on and turn-off switching speed of the power device.

8. The CPGD circuit of claim 7, wherein an actual turn-on switching speed of the power device depends on a relationship of actual $V_{Cd1}$ and derived threshold pump voltages provided by:

$$\begin{cases} V_{Cd1,th1} = \dfrac{C_{gs}(V_{cc} + V_{ee} - 2V_{df}) + Q_{gd}}{C_{f1} + C_{d1}} + (V_{cc} - V_{df}) \\ V_{Cd1,th2} = \dfrac{C_{gs}(V_{miller} + V_{ee} - V_{df}) + Q_{gd}}{C_{f1} + C_{d1}} + (V_{cc} - V_{df}) \\ V_{Cd1,th3} = \dfrac{C_{gs}(V_{miller} + V_{ee} - V_{df}) + Q_{gd}}{C_{f1} + C_{d1}} + (V_{cc} - V_{df}) \\ V_{Cd1,th4} = \dfrac{C_{gs}(V_{th} + V_{ee} - V_{df}) + Q_{gd}}{C_{f1} + C_{d1}} + (V_{cc} - V_{df}) \\ V_{Cd1,th5} = (V_{cc} - V_{df}) \end{cases}$$

where a Miller plateau $V_{miller}=i_{load}/g_{fs}$, $i_{load}$ is a load current, and $g_{fs}$ is a transconductance of power device.

9. The CPGD circuit of claim 8, wherein if $V_{Cd1}=V_{Cd1,th1}$, the maximum turn-on switching speed is achieved, resulting in a minimum turn-on delay time, i.e., ($t_3$-$t_2$), and maximum values for $i_d$ current rising rate, $v_{ds}$ voltage falling rate, and $v_{gs}$ voltage rising rate after the Miller plateau.

10. The CPGD circuit of claim 9, wherein if $V_{Cd1,th2} \leq V_{Cd1} < V_{Cd1,th1}$, the turn-on delay time, $i_d$ current rising rate, and $v_{ds}$ voltage falling rate undergo full acceleration, the $v_{gs}$ voltage rising rate after the Miller plateau undergoes a partial acceleration.

11. The CPGD circuit of claim 10, wherein if $V_{Cd1,th3} \leq V_{Cd1} < V_{Cd1,th2}$, both the turn-on delay time and $i_d$ current rising rate undergo the full acceleration, while the vas voltage falling rate undergoes a partial acceleration.

12. The CPGD circuit of claim 11, wherein if $V_{Cd1,th4} \leq V_{Cd1} < V_{Cd1,th3}$, then only a turn-on delay time undergoes full acceleration, while the $i_d$ current rising rate undergoes a partial acceleration.

13. The CPGD circuit of claim 12, wherein if $V_{Cd1,th5} \leq V_{Cd1} < V_{Cd1,th4}$, a minimum turn-on switching speed is achieved, resulting in minimum values for $i_d$ current rising rate, $v_{ds}$ voltage falling rate, and $v_{gs}$ voltage rising rate after the Miller plateau, while the turn-on delay time undergoes a partial acceleration.

14. The CPGD circuit of claim 7, wherein a maximum turn-on switching speed is calculated as:

$$\begin{cases} t_{cr,min} = R_{gon}C_{e1}\ln\dfrac{C_{e1}(V_{Cd1,th1} + V_{ee} - V_{df}) - C_{gs}(V_{th} + V_{ee} - V_{df})}{C_{e1}(V_{Cd1,th1} + V_{ee} - V_{df}) - C_{gs}(V_{miller} + V_{ee} - V_{df})}, \\ C_{e2} = \dfrac{(C_{f1} + C_{d1})C_{gs}}{C_{f1} + C_{d1} + C_{gs}} \\ t_{vf,min} = R_{gon}(C_{f1} + C_{d1})\ln\dfrac{1}{1 - \dfrac{Q_{gd}}{(C_{d1} + C_{f1})(V_{Cd1,th1} - V_{miller}) - C_{gs}(V_{miller} + V_{ee} - V_{df})}} \end{cases}$$

where $t_{cr,min}$ is the minimum $i_d$ current rising time, $t_{vf,min}$ is the minimum $v_{ds}$ voltage falling time, and $R_{gon}=R_{g,int}+R_{gon,ext}$.

15. The CPGD circuit of claim 14, wherein a minimum turn-on switching speed is calculated as:

$$t_{cr,max} = R_{gon}C_{gs}\ln\dfrac{V_{cc} - V_{df} - V_{th}}{V_{cc} - V_{df} - V_{miller}}$$

$$t_{vf,max} = R_{gon}\dfrac{Q_{gd}}{V_{cc} - V_{df} - V_{miller}}$$

where $t_{cr,max}$ is the maximum $i_d$ current rising time, $t_{vf,max}$ is the maximum $v_{ds}$ voltage falling time, and $V_{dc}$ is a dc-link voltage.

16. The CPGD circuit of claim 15, wherein an actual turn-off switching speed of the power device depends on a relationship of actual $V_{Cd2}$ and derived threshold pump voltages found by:

$$\begin{cases} V_{Cd2,th1} = \dfrac{C_{gs}(V_{cc} + V_{ee} - 2V_{df}) + Q_{gd}}{C_{f2} + C_{d2}} + (V_{ee} - V_{df}) \\ V_{Cd2,th2} = \dfrac{C_{gs}(V_{cc} - V_{df} - V_{th}) + Q_{gd}}{C_{f2} + C_{d2}} + (V_{ee} - V_{df}) \\ V_{Cd2,th3} = \dfrac{C_{gs}(V_{cc} - V_{df} - V_{miller}) + Q_{gd}}{C_{f2} + C_{d2}} + (V_{ee} - V_{df}) \\ V_{Cd2,th4} = \dfrac{C_{gs}(V_{cc} - V_{df} - V_{miller}) + Q_{gd}}{C_{f2} + C_{d2}} + (V_{ee} - V_{df}) \\ V_{Cd2,th5} = (V_{ee} - V_{df}) \end{cases}$$

where a Miller plateau $V_{miller}=i_{load}/g_{fs}$, $i_{load}$ is a load current, and go is a transconductance of the power device.

17. The CPGD circuit of claim 16, wherein if $V_{Cd2}=V_{Cd2,th1}$, the maximum turn-off switching speed is achieved, resulting in a minimum turn-off delay time, i.e., ($t_3$-$t_2$), and the maximum values for $v_{ds}$ voltage rising rate, $i_d$ current falling rate, and $v_{gs}$ voltage falling rate after reaching $V_{th}$.

18. The CPGD circuit of claim 17, wherein if $V_{Cd2,th2} \leq V_{Cd2} < V_{Cd2,th1}$, the turn-off delay time, $v_{ds}$ voltage rising rate and $i_d$ current falling rate undergo full acceleration, the $v_{gs}$ voltage falling rate after reaching $V_{th}$ undergoes a partial acceleration.

19. The CPGD circuit of claim 18, wherein if $V_{Cd2,th3} \leq V_{Cd2} < V_{Cd2,th2}$, both the turn-off delay time, and $v_{ds}$ voltage rising rate undergo the full acceleration, while the $i_d$ current falling rate undergoes a partial acceleration.

20. The CPGD circuit of claim 19, wherein if $V_{Cd2,th4} \leq V_{Cd2} < V_{Cd2,th3}$, then only the turn-off delay time undergoes the full acceleration, while the $v_{ds}$ voltage rising rate undergoes a partial acceleration.

21. The CPGD circuit of claim 20, wherein if $V_{Cd2,th5} \leq V_{Cd2} < V_{Cd2,th4}$, the minimum turn-off switching speed is achieved, resulting in the minimum values for $v_{ds}$ voltage rising rate, $i_d$ current falling rate, and $v_{gs}$ voltage falling rate after reaching $V_{th}$, while the turn-off delay time undergoes a partial acceleration.

22. The CPGD circuit of claim 7, wherein the maximum turn-off switching speed is calculated as:

$$\begin{cases} t_{vr,min} = R_{goff}(C_{f2} + C_{d2})\ln\dfrac{1}{1 - \dfrac{Q_{gd}}{(C_{d2} + C_{f2})(V_{Cd2,th1} + V_{miller}) - C_{gs}(V_{cc} - V_{df} - V_{miller})}} \\ t_{cf,min} = R_{goff}C_{e2}\ln\dfrac{1}{1 - \dfrac{C_{gs}(V_{miller} - V_{th})}{C_{e2}(V_{Cd2,th1} + V_{miller}) - \dfrac{C_{e2}}{C_{d2} + C_{f2}}(C_{gs}(V_{cc} - V_{df} - V_{miller}) + Q_{gd})}} \\ C_{e2} = \dfrac{(C_{f2} + C_{d2})C_{gs}}{C_{f2} + C_{d2} + C_{gs}} \end{cases}$$

where $t_{vr,min}$ is the minimum $v_{ds}$ voltage rising time, $t_{cf,min}$ is the minimum $i_d$ current falling time, and $R_{goff} = R_{g,int} + R_{goff,ext}$.

23. The CPGD circuit of claim 22, wherein a minimum turn-off switching speed is calculated as:

$$t_{vr,max} = R_{goff} \frac{Q_{gd}}{V_{ee} - V_{df} + V_{miller}}$$

$$t_{cf,max} = R_{goff} C_{gs} \ln \frac{V_{miller} + V_{ee} - V_{df}}{V_{th} + V_{ee} - V_{df}}$$

where $t_{vr,max}$ is the maximum $v_{ds}$ voltage rising time, $t_{cf,max}$ is the maximum $i_d$ current falling time.

* * * * *